(12) United States Patent
Ageishi et al.

(10) Patent No.: US 8,103,489 B2
(45) Date of Patent: Jan. 24, 2012

(54) TIRE DESIGN METHOD

(75) Inventors: Naoya Ageishi, Osaka (JP); Yoshihiro Tanaka, Osaka (JP); Ken Ishihara, Osaka (JP)

(73) Assignee: Toyo Tire & Rubber Co., Ltd., Osaka (JP)

( * ) Notice: Subject to any disclaimer, the term of this patent is extended or adjusted under 35 U.S.C. 154(b) by 798 days.

(21) Appl. No.: 12/132,006

(22) Filed: Jun. 3, 2008

(65) Prior Publication Data

US 2008/0302466 A1 Dec. 11, 2008

(30) Foreign Application Priority Data

Jun. 8, 2007 (JP) ................. 2007-152348

(51) Int. Cl.
*G06F 17/10* (2006.01)
*G06F 19/00* (2011.01)
(52) U.S. Cl. ............. 703/2; 703/1; 703/6; 700/117
(58) Field of Classification Search .......... 703/1, 2, 703/6; 156/110.1; 73/146; 700/95, 97, 117
See application file for complete search history.

(56) References Cited

U.S. PATENT DOCUMENTS

| | | | |
|---|---|---|---|
| 5,361,816 A | 11/1994 | Hitzky | |
| 5,710,718 A | 1/1998 | Kamegawa et al. | |
| 6,083,268 A | 7/2000 | Kelsey et al. | |
| 6,230,112 B1 | 5/2001 | Ishiyama | |
| 6,430,993 B1 | 8/2002 | Seta | |
| 6,531,012 B2 | 3/2003 | Ishiyama | |
| 2001/0032694 A1 | 10/2001 | Ishiyama | |
| 2002/0014294 A1 | 2/2002 | Okano et al. | |
| 2008/0270084 A1* | 10/2008 | Ageishi | ............. 703/1 |
| 2008/0300840 A1 | 12/2008 | Tanaka | |
| 2008/0302465 A1* | 12/2008 | Ageishi et al. | ......... 156/110.1 |
| 2008/0302466 A1 | 12/2008 | Ageishi et al. | |

FOREIGN PATENT DOCUMENTS

| | | |
|---|---|---|
| JP | 2002-15010 | 1/2002 |
| JP | 2002-149717 | 5/2002 |
| JP | 2003-16141 | 1/2003 |
| JP | 2003-150645 | 5/2003 |

(Continued)

OTHER PUBLICATIONS

Hasegawa et al., "A Method for the Shape and Topology Optimization of Mechanical Structures by Using Genetic Algorithm," Transactions of Japan Society of Mechanical Engineers (Series A), 61(581):183-190(1995).

(Continued)

*Primary Examiner* — Russell Frejd
(74) *Attorney, Agent, or Firm* — Fish & Richardson P.C.

(57) ABSTRACT

A tire is designed using a tire FEM model by obtaining an optimal solution for a tire structure which optimizes an objective function with a tread pattern shape kept fixed and performing a numerical optimization for obtaining an optimal solution for the tread pattern shape which optimizes the objective function with the tire structure kept fixed. The optimization for the tire structure is performed using a tire model having a tread pattern shape optimized at the immediately preceding cycle of the operation of optimizing the tread pattern shape. The optimization for the tread pattern shape is performed using a tire model having a tire structure optimized at the preceding cycle of the operation of optimizing the tire structure. The optimizing operations are repeated until convergence of optimal solutions obtained by those operations takes place.

10 Claims, 16 Drawing Sheets

FOREIGN PATENT DOCUMENTS

| | | |
|---|---|---|
| JP | 2005-8011 | 1/2005 |
| JP | 2005-65996 | 3/2005 |
| JP | 2005-100282 | 4/2005 |
| JP | 2006-111168 | 4/2006 |
| JP | 2006-199217 | 8/2006 |

OTHER PUBLICATIONS

Tsuruta et al., "A Method for Shape and Topology Optimization of Mechanical Structures by Using Genetic Algorithm," Transactions of Japan Society of Mechanical Engineers (Series A), 63(605):170-177 (1997).

Suzuki et al., "A Method for Shape and Topology Optimization of Mechanical Structures by Using Genetic Algorithm," Transactions of Japan Society of Mechanical Engineers (Series A), 64(626):4954 (1998).

Zhang, S., "Computer Aided Shape Optimization for Engineering Design With MSC/NASTRAN," pp. 1-20.

Leiva and Watson, "Automatic Generation of Basis Vectors for Shape Optimization in the *Genesis* Program," American Institute of Aeronautics and Astronautics, pp. 1-8, 1998.

Zhang, "Modified Thermal Load Approach for Automatic Generation of Basis Vectors in Shape Optimization," American Institute of Aeronautics and Astronautics, pp. 384-390, 1976.

Au et al., "A Fuzzy Approach to Partitioning Continuous Attributes for Classification" (2006).

Camacho, G.T., et al., "Adaptive Lagrangian Modeling of Ballistic Penetration of Metallic Targets," Computer Methods in Applied Mechanics and Engineering (1997).

Final Office Action dated Mar. 3, 2011 mailed in co-pending U.S. Appl. No. 12/106,384.

Japanese Office Action dated Apr. 14, 2011 mailed in co-pending Japanese Application No. 2007-152348 and English translation thereof.

Japanese Office Action dated Apr. 14, 2011 mailed in co-pending Japanese Application No. 2007-118714 and English translation thereof.

Non-Final Office Action dated Mar. 30, 2011 mailed in co-pending U.S. Appl. No. 12/131,993.

Non-Final Office Action dated Sep. 30, 2010 mailed in co-pending U.S. Appl. No. 12/106,384.

Non-Final Office Action dated Sep. 30, 2010 mailed in co-pending U.S. Appl. No. 12/098,780.

Notice of Allowance dated Mar. 1, 2011 mailed in co-pending U.S. Appl. No. 12/098,780.

J.R. Cho, et al., "Mesh Generation Considering Detailed Tread Blocks for Reliable 3D Tire Analysis," Advances in Engineering Software 35 (2004).

Kim et al., "Variable Chromosome Length Genetic Algorithm for Structural Topology Design Optimization" (2004).

Patel, H.D., "Shape Parameterization and Optimization Using the Boundary Shapes Concept" (2006).

\* cited by examiner

ONE PITCH UNIT

FIRST PITCH

SECOND PITCH

THIRD PITCH

FOURTH PITCH

FIFTH PITCH

ELEMENT A

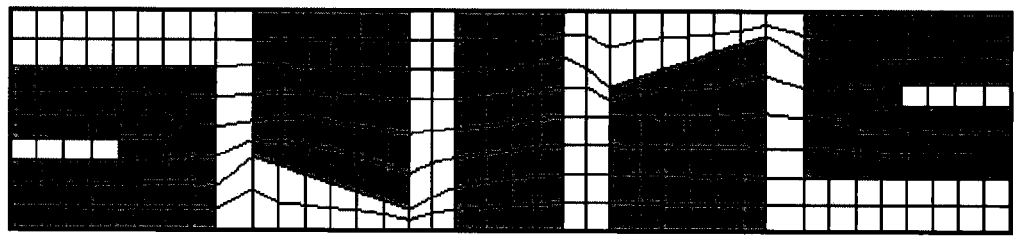
*Fig.16D* BASE SHAPE 3
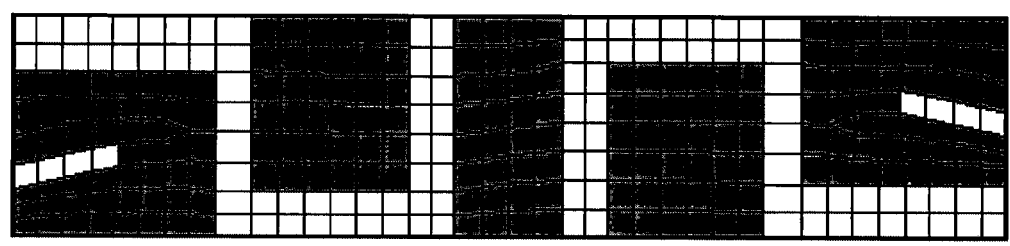
*Fig.16C* BASE SHAPE 2
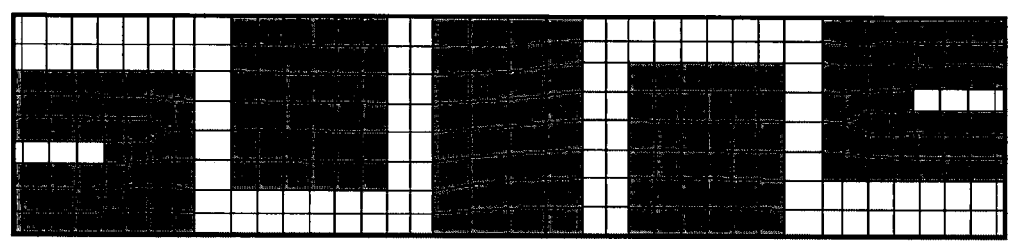
*Fig.16B* BASE SHAPE 1
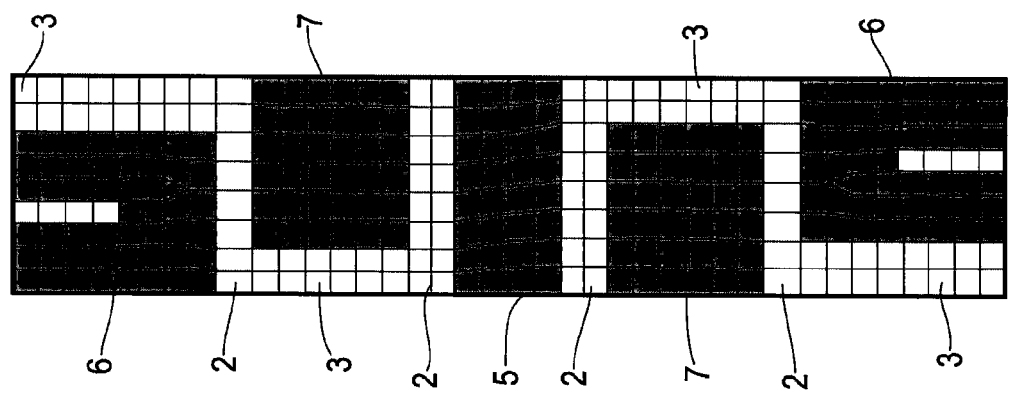
*Fig.16A* ORIGINAL SHAPE

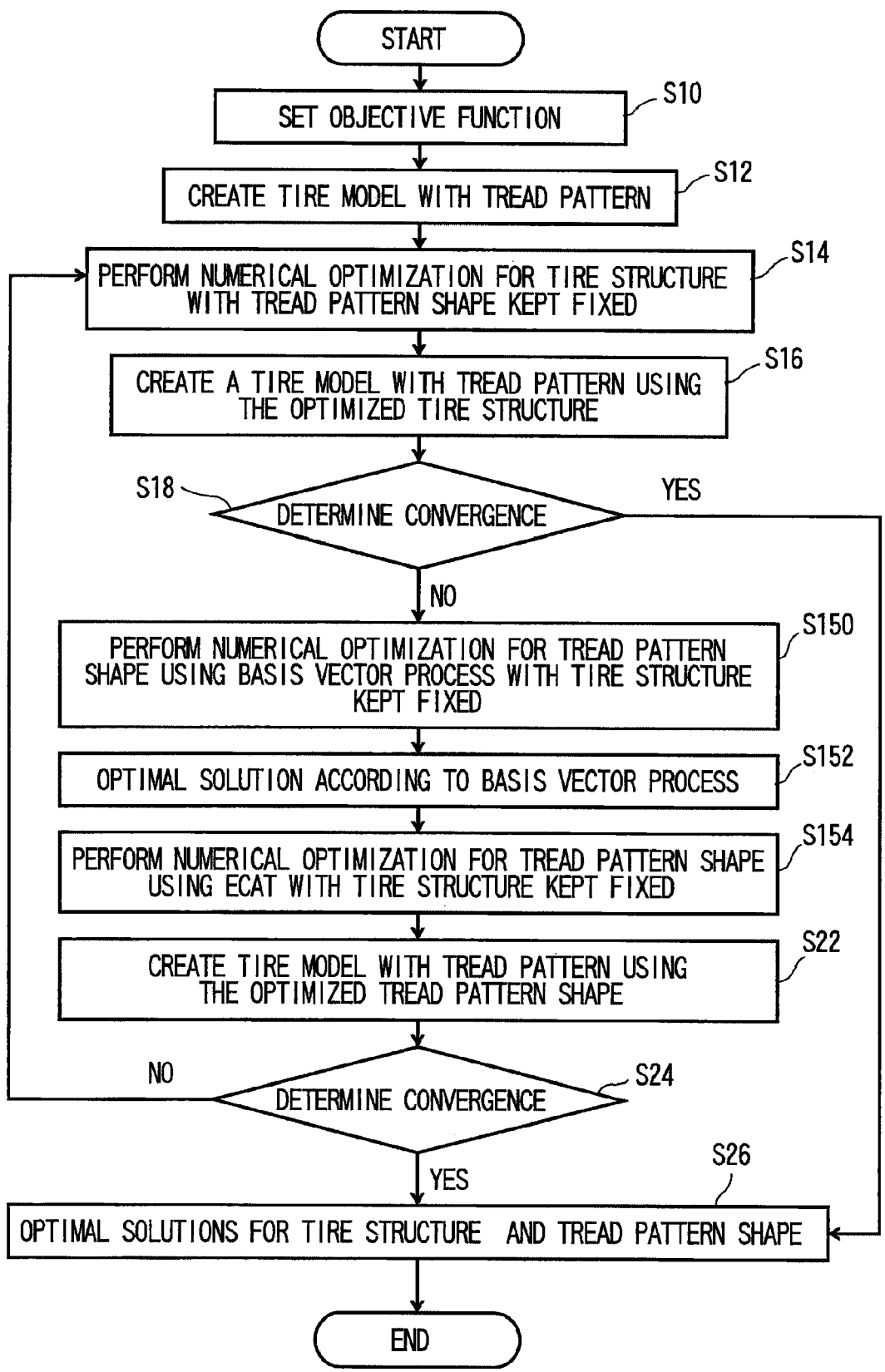

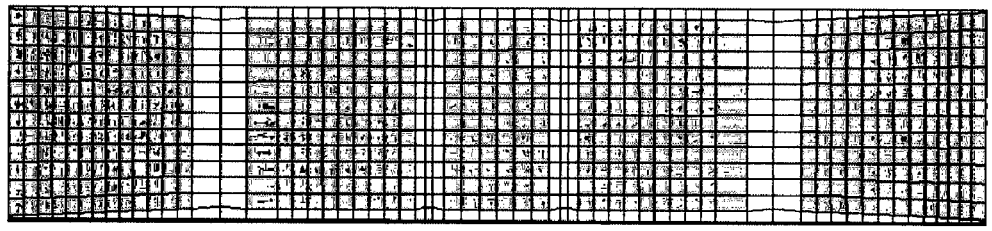
*Fig.18A* ORIGINAL SHAPE
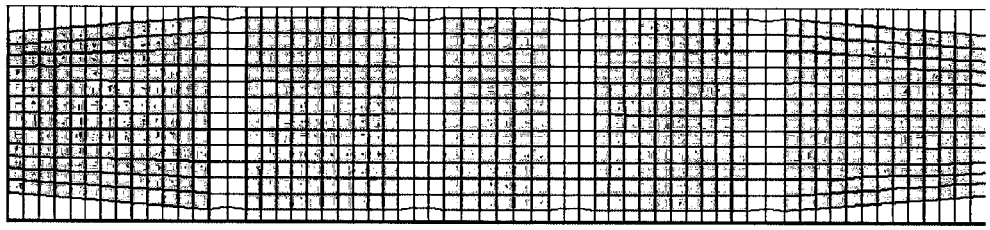
*Fig.18B* BASE SHAPE 1
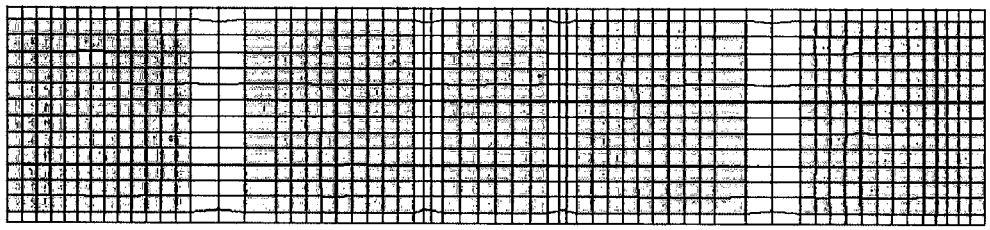
*Fig.18C* BASE SHAPE 2
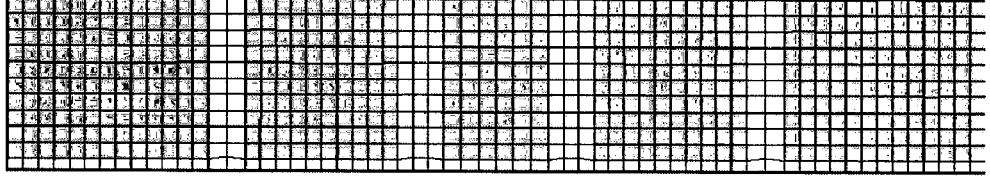
*Fig.18D* OPTIMIZED SHAPE

TIRE DESIGN METHOD

CROSS-REFERENCE TO RELATED APPLICATIONS

This application is based upon and claims the benefit of priority from the prior Japanese Patent Application No. 2007-152348, filed on Jun. 8, 2007; the entire contents of which are incorporated herein by reference.

BACKGROUND

The present invention relates to a tire design method.

When a pneumatic tire is designed, a design plan satisfying performance requirements is made based on knowledge of the related art, experiences, and limitations on designing. One approach for verification of the design is to check whether the performance requirements are satisfied or not using a structural analysis. When it is revealed at this stage that the performance requirements are not satisfied, the design is corrected, and a structural analysis is conducted again to verify the design. This process is repeated until the performance requirements are satisfied, and a design plan is thereby finalized.

According to the design method in the related art, no guarantee is given on whether a design plan finalized within a range set based on design limitations provides optimal values or not. Since the method involves the process of repeating designing, structural analysis, and re-designing, a design task will require an enormous amount of time. Under the circumstance, various methods for optimizing a tire through numerical optimizations have been proposed in an intention to allow efficient designing (see U.S. Pat No. 5,710,718A, U.S. Pat. No. 6,230,112B1, U.S. Pat. No. 6,531,012B2, Japanese Patent Laid-Open No. JP-A-2005-008011).

No quantitative understanding has been reached yet on the relationship between characteristics of a pneumatic tire and a tire structure such as a tire sectional shape including internal structures and a property of the material of a tire component, and the shape of a tread pattern formed on a tread surface. Therefore, when a pneumatic tire is designed, it is a common practice to decide the structure of the tire first and to design a shape of a tread pattern thereafter. That is, the tire structure and the tread pattern shape are optimized separately. Thus, no attention has been paid for finding of an optimal combination of a tire structure and a tread pattern shape.

In U.S. Pat. No. 5,710,718A, design variables for numerical optimizations are listed, including a function representing the shape of a carcass line or the like, a variable representing a gauge distribution of a tire rubber member, e.g., a gauge distribution of a bead filler, a variable representing a structure of a belt portion, e.g., the angle of each belt layer, and a variable representing a pattern shape such as a block shape. The document describes that at least one of the design variables is included in the optimizations. However, the document includes no specific mention on use of a variable associated with a tire structure and a variable associated with a tread pattern shape as design variables in conjunction with each other. Let us assume that it is suggested to perform optimization using a variable associated with a tire structure and a variable associated with a tread pattern shape as design variables in conjunction with each other. Even in such a case, the optimization will result in a great computational cost and will not necessarily allow designing to be carried out efficiently when the optimization involves what is called strong coupling, i.e., when the optimization is carried out using both of the variables as design variables in conjunction with each other.

SUMMARY

The invention has been made taking the above-described point into consideration, and it is an object of the invention to provide a design method in which optimization of a tire structure can be coupled with optimization of a tread pattern shape to obtain optimal design specifications of the tire as a whole and to design the tire with higher performance.

A tire design method according to embodiments of the invention includes:

(a) deciding an objective function associated with tire performance;

(b) performing a numerical optimization using a tire model provided by dividing the tire into a plurality of elements to obtain an optimal solution for a tire structure which optimizes the objective function, the optimization being performed with a tread pattern shape kept fixed; and (c) performing a numerical optimization using a tire model provided by dividing the tire into a plurality of elements to obtain an optimal solution for a tread pattern shape which optimizes the objective function, the calculation being performed with a tire structure kept fixed, the step (b) performing the numerical optimization for the tire structure using a tire model having a tread pattern shape optimized at the immediately preceding cycle of the step (c), the step (c) performing the numerical optimization for the tread pattern shape using a tire model having a tire structure optimized at the immediately preceding cycle of the step (b), convergence being determined based on optimal solutions obtained at the steps (b) and (c), the numerical optimizations at the steps (b) and (c) being repeated until convergence takes place.

In embodiments of the invention, the term "tire structure" means a structure of a pneumatic tire which can be an object of designing other than a shape of a tread pattern formed on a tread surface, such as a sectional shape of the tire including an internal structure of the tire and a physical property of the material of a tire component. For example, the tire structure may be an outer shape of a section of the tire such as the sectional width of the tire, the tread width, the radius of a crown portion, and the radius of a side portion (i.e., a shape of the mold of the tire). The tire structure may alternatively be a property of the material of each constituent part of the tire, e.g., the Young's modulus of a rubber member such as tread rubber or sidewall rubber or a physical property of the material of a reinforcing member such as a carcass ply or a belt. Still alternatively, the tire structure may be a dimension, angle, density or disposition of such a tire component (including the angle and the number of ends of a cord of a reinforcing member as described above).

In embodiments of the invention, the optimization of a tire structure at the step (b) and the optimization of a tread pattern shape at the step (c) are carried out on the basis of weak coupling. The use of weak coupling makes it possible to obtain optimal solutions for a tire structure and a tread pattern shape at a low computational cost. It is therefore possible to obtain optimal design specifications of a tire as a whole efficiently and to design a tire having improved performance.

BRIEF DESCRIPTION OF THE DRAWINGS

FIGS. 16A, 16B, 16C, and 16D are plan views showing an original shape, a base shape 1, a base shape 2, and a base shape 3 in Example 2, respectively;

FIG. 17 is a flow chart showing a flow of processes of a tire design method in a third embodiment of the invention;

FIGS. 18A, 18B, 18C, and 18D are plan views showing an original shape, a base shape 1, a base shape 2, and an optimized shape 3 in Example 3, respectively.

DETAILED DESCRIPTION

Embodiments of the invention will now be described with reference to the drawings.

First Embodiment

Figure 1:
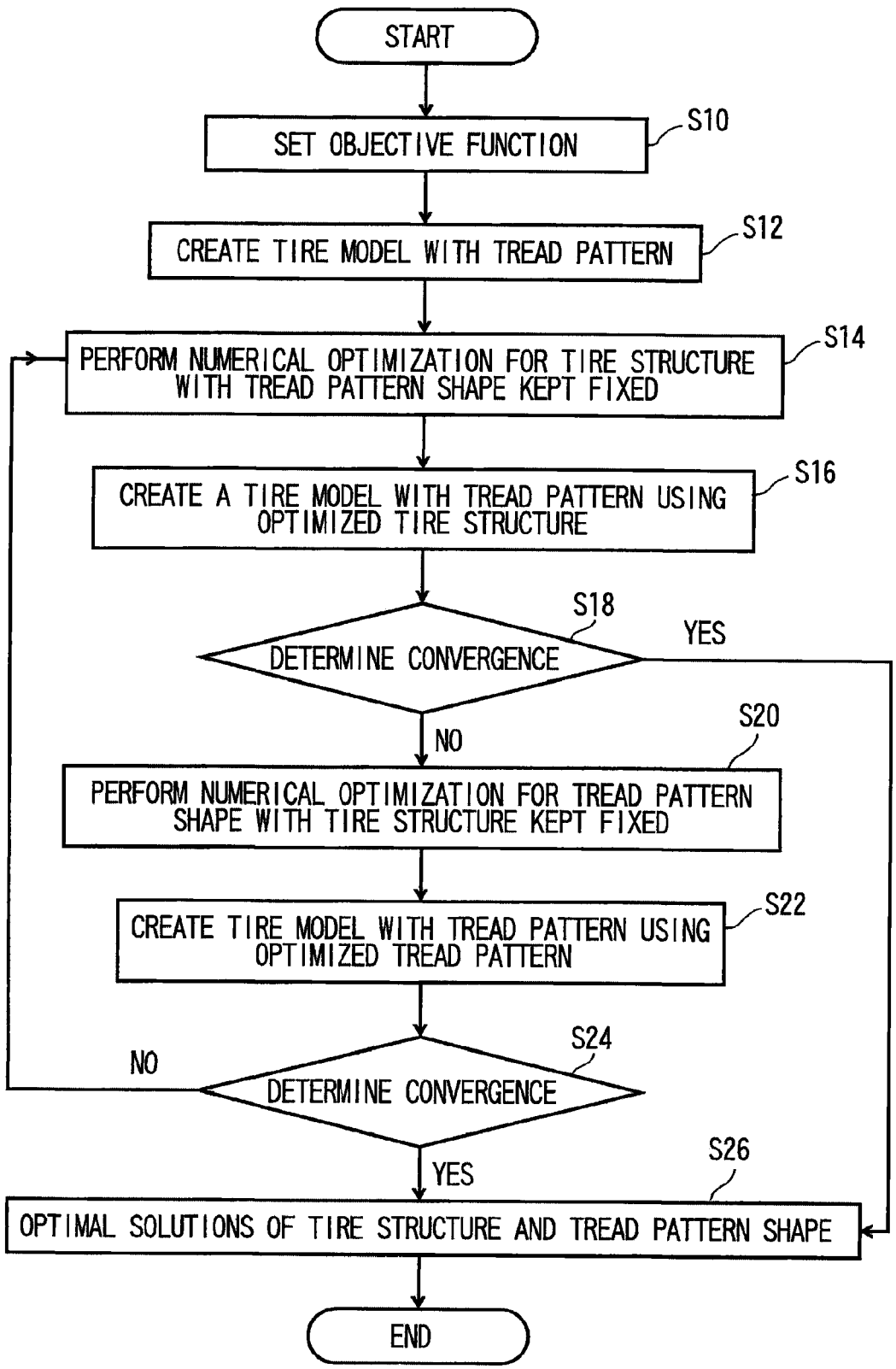
FIG. 1 is a flow chart showing a flow of processes of a tire design method in a first embodiment of the invention.

FIG. 1 is a flow chart showing a flow of processes of a method of designing a pneumatic tire in a first embodiment. The present embodiment represents a design method in which optimization of a tire structure and optimization of the topology and shape of a tire tread pattern according to an ECAT are carried out on the basis of weak coupling. The present embodiment may be implemented using a computer.

Specifically, the design method in the present embodiment can be carried out by creating a program for causing a computer to execute steps as described below and by using a computer such as a personal computer having such a program stored (installed) in a hard disk thereof. The program stored in the hard disk is read into a RAM as occasion demands to execute the same. Calculations are carried out by a CPU using various data input from an input unit such as a keyboard, and calculation results are displayed by a display unit such as a monitor. Such a program may be stored in various types of computer-readable recording media such as CD-ROMs, DVDs, MDs, and MO disks. Therefore, a drive for such a recording medium may be provided in a computer, and the program may be executed using the drive.

According to the design method in the present embodiment, at step S10, an objective function associated with tire performance is first decided, and various conditions required for a numerical optimization such as initial values, design variables, and constraint conditions of a tire structure and a tread pattern shape are set.

The objective function may be a physical quantity whose value changes depending on the tire structure and the tread pattern shape. Specifically, the function may be ground contact pressure distribution of the tire at the time of braking and acceleration, an average ground contact pressure, stress, strain, strain energy, frictional energy, sliding velocity on road surfaces, or displacement of the tire. For example, the ground contact pressure distribution of the tire is chosen as the objective function, and an optimization problem for minimizing the function is defined.

An initial layout of one pitch unit that is an initial value of a tread pattern shape may be a layout in which a tread has no groove at all, a layout in which a tread has only main grooves extending in the circumferential direction thereof, a layout in which a tread has main grooves and lateral grooves extending in a direction across the main grooves, or a layout in which a tread has blocks defined by main grooves and lateral grooves. In the present embodiment, an initial layout of a tread pattern shape having only main grooves or circumferential grooves will be discussed. Therefore, the initial layout in the embodiment is determined by the width of the tread pattern, the length of one pitch unit, the position of the main grooves in the direction of the width of the tire, and the width of the main grooves.

Figure 2:
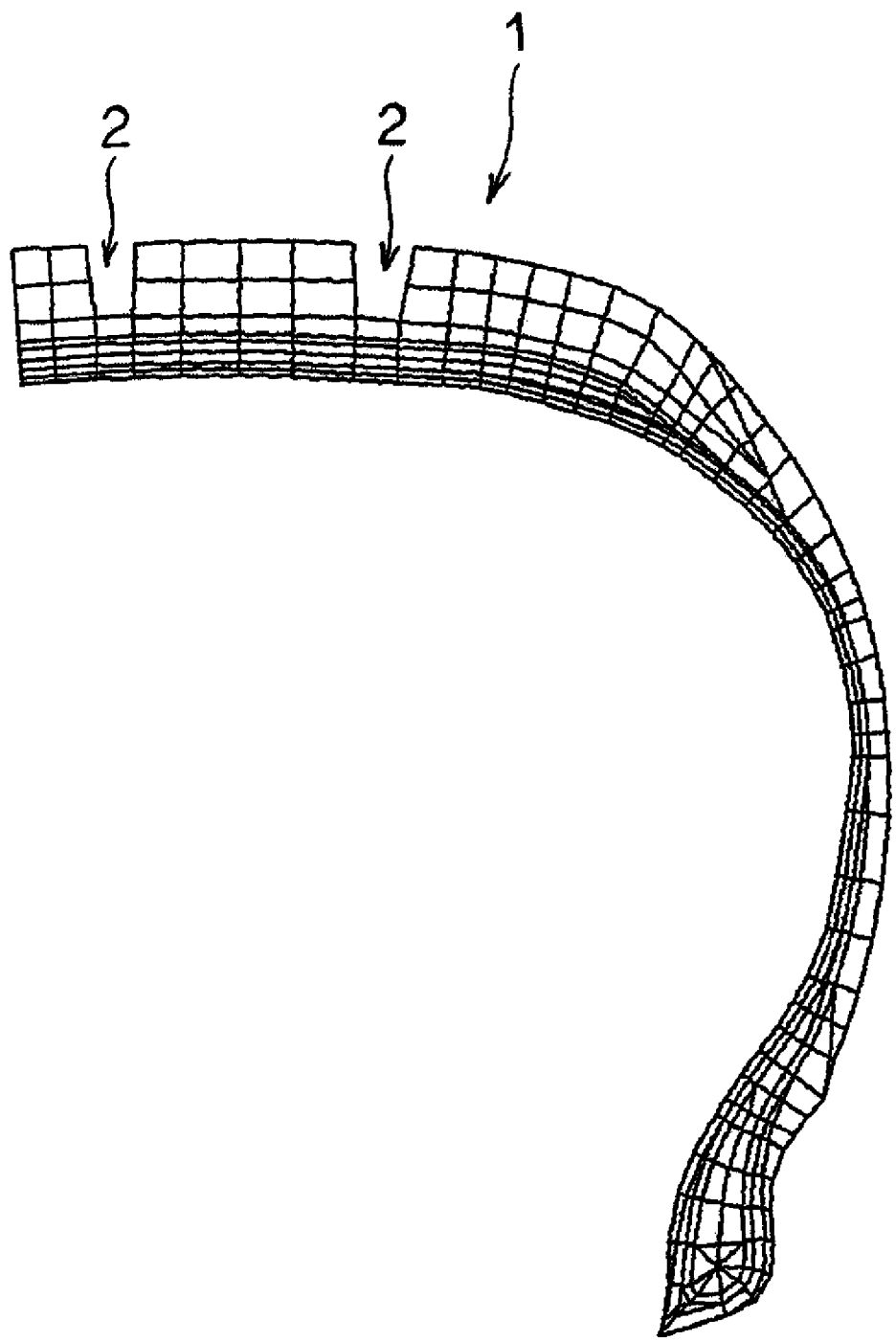
FIG. 2 is a half sectional view of a tire representing an example of a finite element model of a tire.

At step S12, a finite element model of a tire having a tread pattern in the above-described initial layout (hereinafter referred to as "tire FEM model or "tire model" in a simpler form) is created as an initial model. A tire model is a model of a tire created by dividing the tire including internal structures thereof into elements in the form of a mesh such that a physical quantity as described above for evaluating tire performance can be numerically and analytically obtained through a structural analysis. In this mode of the invention, as shown in FIG. 2, a tire FEM model comprising a tread pattern having only main grooves 2 on a surface of a tread 1 is created.

Referring to the creation of such a tire model, one pitch unit of the initial layout is developed into a plurality of pitches in the circumferential direction of the tire to create an FEM model representing the entire circumference of the tire. In this example, since the initial layout is a tread pattern having main grooves only, what is required is only to sweep the two-dimensional FEM model shown in FIG. 2 throughout the circumference of the tire. However, since what is shown in FIG. 2 is a half sectional view of the model, the entire width of the model is swept in practice. At this time, the initial layout is developed in the circumferential direction at equal intervals or unequal intervals depending on the purpose. Through the above-described sweeping, a tire model that is a three-dimensional FEM model is created by developing the initial layout into a plurality of pitches.

At the next step S14, a numerical optimization is carried out using the tire model with the tread pattern shape fixed to obtain an optimal solution for the tire structure which provides an optimal value of the objective function. Such a numerical optimization may be carried out according to various known methods of optimization such as design of experiments (DOE) methods, methods utilizing generic algorithms, and mathematical programming. The present embodiment will be described as an example of optimization of a tire structure using mathematical programming.

Figure 3:
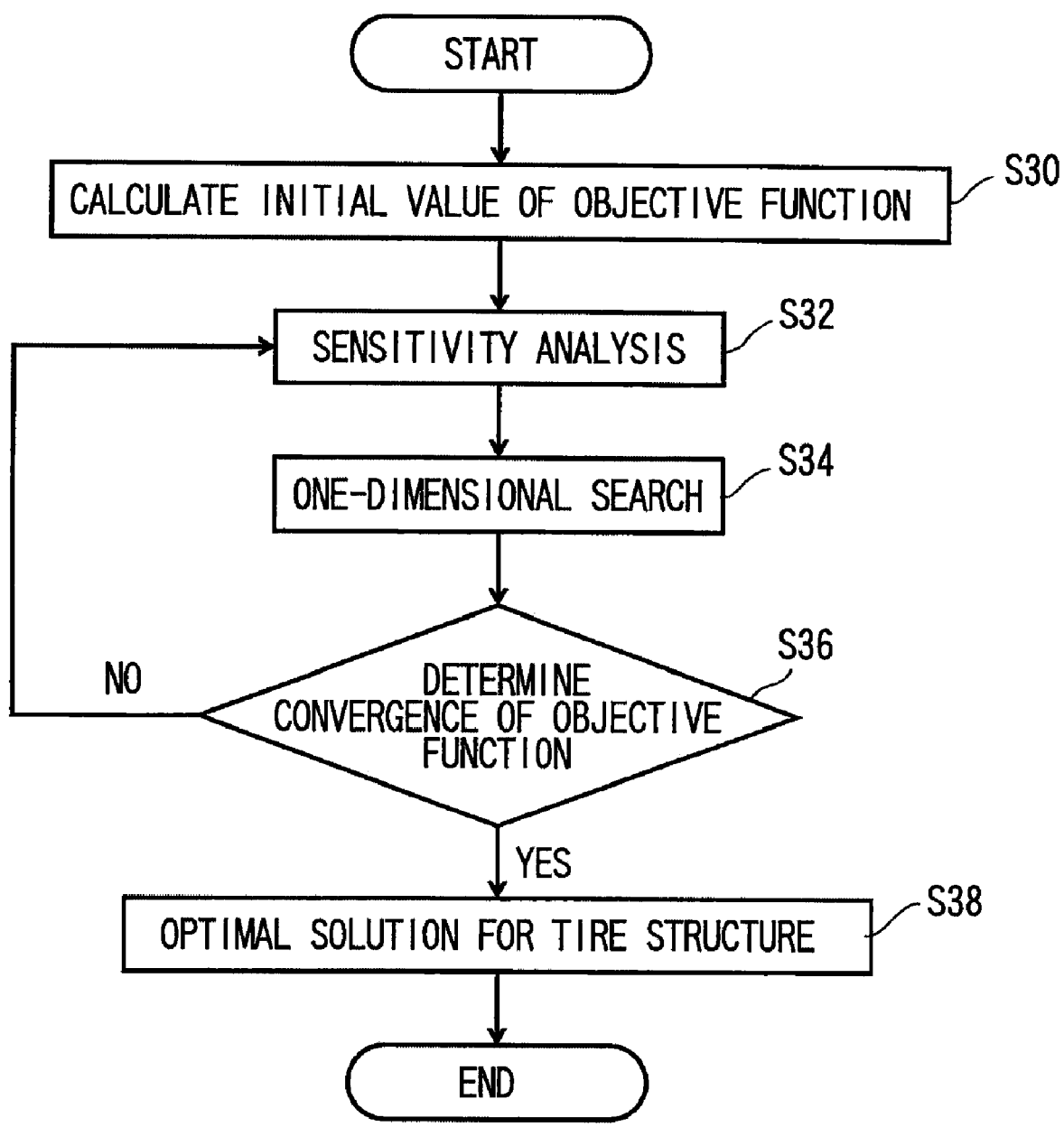
FIG. 3 is a flow chart showing a flow of a numerical optimization for a tire structure in the first embodiment.

In the numerical optimization according to mathematical programming, as shown in FIG. 3, a structural analysis is carried out using the tire model at step S30 to calculate an initial value of the objective function at initial values of design variables associated with the tire structure. The structural analysis is carried out by performing calculations with analysis conditions such as a tire internal pressure, a load, and a coefficient of friction with road surface applied to the tire model. For example, the analysis may be carried out using an FEM analysis program available on the market such as "ABAQUS" manufactured by ABAQUS Inc.

Next, a sensitivity analysis is carried out at step S32. A sensitivity analysis is a process of finding a direction in which sensitivity has the steepest slope by varying each design variable by a predetermined amount little by little. In general, sensitivity is defined by Equation (1) shown below.

$$\text{Sensitivity} = (f(xi+\Delta xi) - f(xi))/\Delta x \quad (1)$$

where $xi$ represents an i-th design variable; $\Delta xi$ represents the amount of a change in the i-th design variable; $f(xi)$ represents the value of the objective function at the design variable $xi$; and $f(xi+\Delta xi)$ represents the value of the objective function at a design variable $xi+\Delta xi$.

Specifically, each design variable $xi$ is varied by an amount $\Delta xi$, and the value of the objective function after the change is calculated. Thus, the sensitivity of the objective function that is the ratio of the amount of a change in the objective function to a unit amount of change in a design variable is calculated for each design variable according to Equation (1) to find a direction in which the sensitivity has the steepest slope.

Thereafter, one dimensional search is executed at step S34 based on the sensitivity taking constraint conditions such as an allowable range of the design variable into consideration to find how much the design variable is to be varied in the direction of the steepest slope. Thus, a solution of the design variable at which the objective function can be optimized (minimized) is obtained, and the value of the objective function is calculated from the solution of the design variable.

At step S36, the initial value of the objective function obtained at step S30 is compared with the value of the objective function obtained at step S34, and a difference between those values is compared with a predetermined threshold to determine whether the value of the objective function has converged or not. When it is determined that convergence has not achieved yet, the process returns to step S32 with the initial value updated, and steps S32 to S36 are repeated until convergence is achieved. When the value of the objective function converges, the value of the design variable at that time is adopted as an optimal solution which gives a value of the objective function optimal for the tire structure, at step S38.

Next, at step S16, a tire model with a tread pattern having a tire structure optimized as described above is created. Thereafter, determination of convergence is carried out at step S18 based on the optimal solution obtained at step S14. For example, the determination of convergence is made based on whether the value of the design variable as an optimal solution remains unchanged across step S14 of the numerical optimization for the tire structure. When a difference between the initial value of the design variable before step S14 and the optimal solution of the design variable after step S14 is equal to or greater than a predetermined threshold, it is determined that convergence has not been achieved, and the process proceeds to step S20. When the difference is smaller than the predetermined threshold, it is determined that convergence has been achieved, and the process proceeds to step S26. Normally, convergence does not take place at a first cycle of the numerical optimization, and the process therefore proceeds to step S20. What is required is that the determination of convergence is made based on an optimal solution. Therefore, the determination may be made based on whether the value of the objective function calculated from the optimal solution remains unchanged across step S14 instead of the determination using the design variable as described above.

At step S20, a numerical optimization is carried out using a tire model having a tire structure obtained through optimization at step S14 to obtain an optimal solution of the tread pattern shape which optimizes the objective function, the optimization being carried out with the tire structure kept fixed. In the present embodiment, the numerical optimization for the tread pattern shape is carried out using an ECAT (Evolutional Clustering Algorithm for Topological Optimization).

The ECAT is a process of optimizing a layout using the finite element method. The process is described as a problem of optimizing layouts of mechanical structures such as cantilevers in, for example, Hiroshi Hasegawa and Keishi Kawamo, "A Method for the Shape and Topology Optimization of Mechanical Structures by Using Generic Algorithm (Layout Optimization Method by Adoption of Removal and Addition Parameters of Finite Elements as Chromosomes)", Transactions of Japan Society of Mechanical Engineers (Series A), Vol. 61, No. 581, (1995-1), pp. 183-190 (hereinafter referred to as "Reference Document 1", Yasushi Tsuruta, Hiroshi Hasegawa and Keishi Kawamo, "A Method for Shape and Topology Optimization of Mechanical Structures by Using Generic Algorithm (2nd Report, on Convergence of Solutions of Our Method by Adoption of Removal and Addition Parameters of Finite Elements as Chromosomes)", Transactions of Japan Society of Mechanical Engineers (Series A), Vol. 63, No. 605 (1997-1), pp. 170-177, and Yusaku Suzuki, Hiroshi Hasegawa and Keishi Kawamo, "A Method for Shape and Topology Optimization of Mechanical Structures by Using Generic Algorithm (3rd Report, A Deterministic Approach with a Single Individual by Using Removal and Addition Parameters)", Transactions of Japan Society of Mechanical Engineers (Series A), Vol. 64, No. 626 (1998-10), pp. 49-54, the entire contents (all pages) of those references being incorporated herein by reference.

In the present embodiment, such an ECAT is applied to a problem of optimizing a tire tread pattern shape. Specifically, a tread pattern shape that is a layout is regarded as one individual body, and elements are classified according to the magnitudes of their evaluation indices which are calculated from a finite element model of the tread pattern shape. A global distribution of the evaluation indices in the layout is obtained, and a final layout is decided through evolution of behaviors which are actions of removing or adding (restoring) the elements.

Figure 4:
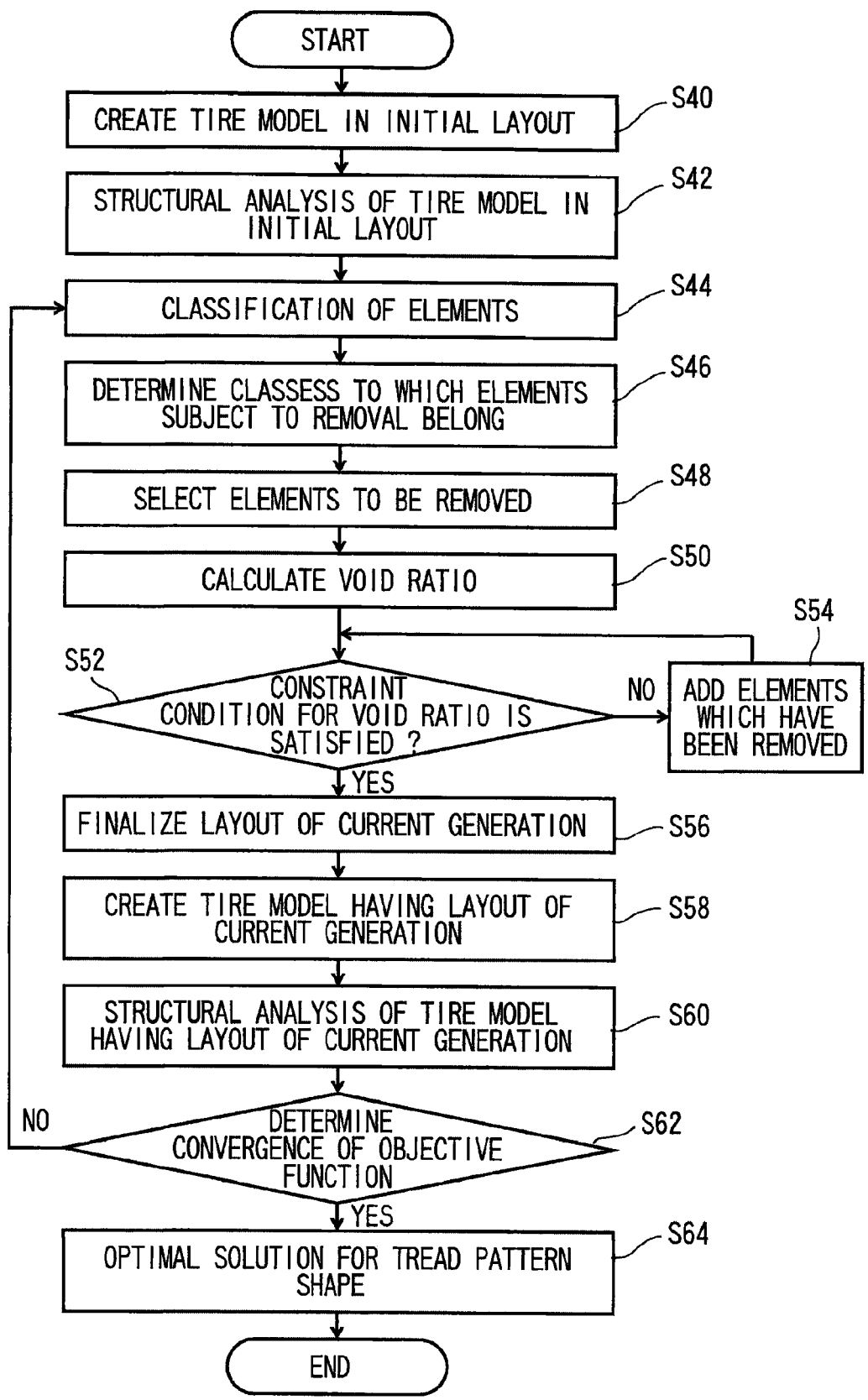
FIG. 4 is a flow chart showing a flow of a numerical optimization according to an ECAT involved in a numerical optimization for a tread pattern shape in the first embodiment.

More particularly, at step S40, a tire model is created for a tire that is obtained by developing one pitch unit of the initial layout of the tread pattern shape into a plurality pitches in the tire circumferential direction, as shown in FIG. 4. In this case, the tire model having an optimized tire structure created at step S16 is used as it is.

At the next step S42, a structural analysis is carried out using the tire model having the initial layout as described above to calculate an evaluation index for each element of a ground contact surface of the tire tread pattern. The evaluation index is a physical quantity which is calculated for each element of the ground contact surface and which serves as a basis for the calculation of the objective function as tire performance. For example, the evaluation index may be stress, strain, strain energy, ground contact pressure, ground contact pressure distribution, frictional energy, sliding velocity on road surfaces, or displacement.

At the next step S44, evaluation indices calculated as described above are integrated to represent one pitch unit of each element associated therewith, and the elements are classified according to the magnitudes of the evaluation indices thus integrated.

Figure 5:
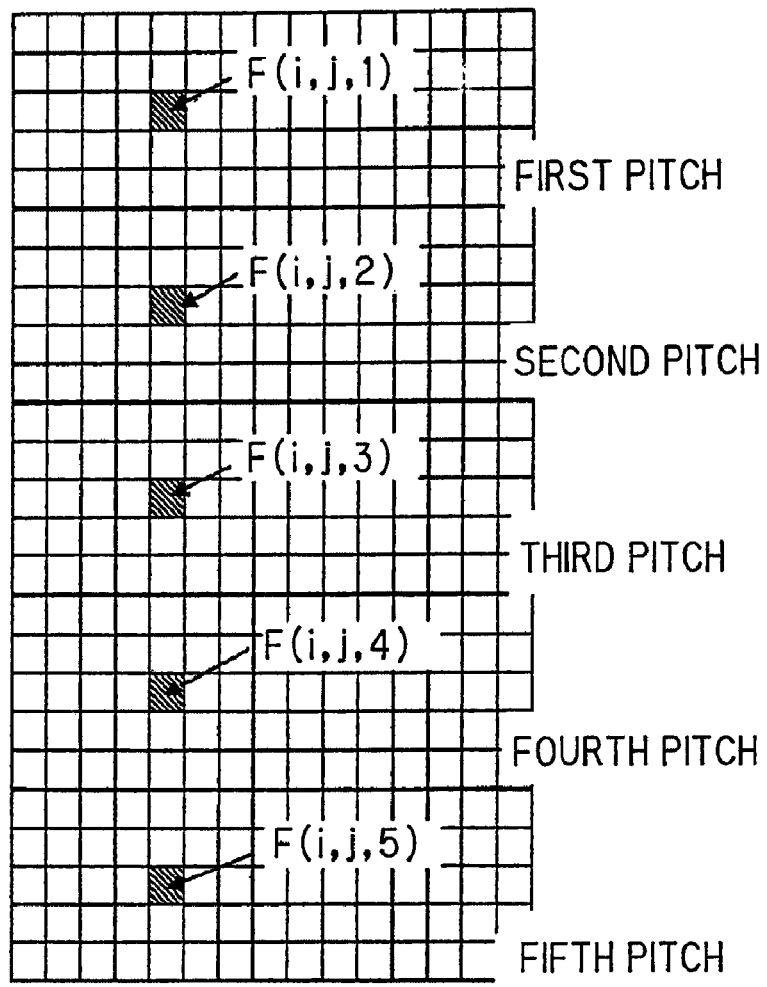
FIG. 5 shows a position for evaluating a function of an evaluation index of an arbitrary element in an example wherein a layout is developed into five pitches, such a position being shown for each pitch.

A method of integrating evaluation indices to represent one pitch unit will now be described with reference to FIGS. 5 and 6. When five pitches are periodically disposed as shown in FIG. 5, functions of the evaluation indices of elements respectively associated with the pitches are expressed as follows.

First Pitch: F(i, j, 1)
Second Pitch: F(i, j, 2)
Third Pitch: F(i, j, 3)
Fourth Pitch: F(i, j, 4)
Fifth Pitch: F(i, j, 5)

Figure 6:
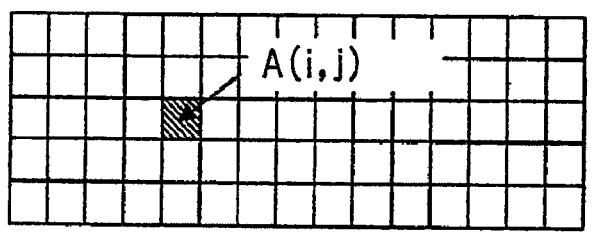
FIG. 6 shows a position for evaluating a function of an evaluation index of an arbitrary element obtained by integrating functions of evaluation indices for various pitches to represent one pitch unit.

Therefore, when those evaluation indices are integrated to represent one pitch unit as shown in FIG. 6, the evaluation index of an arbitrary element in the layout in the one pitch unit or a function A (i, j) of an integrated evaluation index is expressed by Equation (2) shown below.

$$A(i, j) = \frac{\sum_{k=1}^{N} F(i, j, k)}{N} \quad (2)$$

where N represents the number of pitches.

When the indices are integrated to represent one pitch unit, an average value may be obtained as shown. Alternatively, a total value may be simply obtained.

Elements included in the layout of one pitch unit are classified based on an evaluation index thus integrated. Specifically, the classification is carried out by categorizing the magnitude of the evaluation index into a plurality of levels. For example, the difference between a minimum value and a maximum value of the evaluation index is divided into ten equal parts to set ten levels, and all elements are allocated to respective levels associated therewith and are thereby categorized into ten classes. The classes may be set at equal intervals as thus described and may alternatively be set at unequal intervals.

At the next step S46, classes to which elements subject to removal belong are determined. Such determination of classes subject to removal is carried out according to the level of magnitude of the evaluation index of each class.

Specifically, when elements having great evaluation indices are subject to removal just as in the case where the evaluation index is distribution of a ground contact pressure (i.e., a square of a difference between an average ground contact pressure and a ground contact pressure of an element of interest), a plurality of classes having evaluation indices on the greater side are determined as classes subject to removal. On the contrary, when elements having small evaluation indices are subject to removal (for example, when a pattern for increasing deflection of a tread portion is to be designed, elements having small displacements are removed), a plurality of classes having evaluation indices on the smaller side are determined as classes subject to removal. More specifically, classes subject to removal can be determined based on Equation (3) shown below.

$$N_{c\beta} = \beta N_{c\mu} \quad (3)$$

where $N_{c\beta}$ represents an upper limit for class numbers to which elements subject to removal belong; $N_{c\mu}$ represents class numbers to which elements having an average evaluation index value belong; and $\beta$ represents a removal factor. Elements belonging to classes having class numbers equal to and smaller than the value $N_{c\beta}$ given by Equation (3) are subject to removal. Referring to class numbers, when elements having great evaluation indices are subject to removal, the class numbers are assigned starting with the smallest number to elements having great evaluation indices in decreasing order of the magnitude of the index values. When elements having small evaluation indices are subject to removal, the class numbers are assigned starting with the smallest number to elements having small evaluation indices in increasing order of the magnitude of index values. The removal factor $\beta$ may have a predetermined value. Alternatively, it may be obtained along with an $\alpha$-cut value and an addition factor $\gamma$ by performing a numerical optimization such as a generic algorithm for coding such parameters in chromosomes as genes as described in Reference Document 1. The addition factor $\gamma$ is a factor defined by Equation (4) shown below as described in Reference Document 1.

$$N_{p\gamma} = \gamma N_{ps} \quad (4)$$

where $N_{p\gamma}$ represents the number of elements added, and $N_{ps}$ represents the cumulative number of elements removed. At steps S50 to S54 which will be described later, instead of determining elements to be added based on a void ratio, a history of removal may be stored for elements which have been removed in the order of the occurrence of removal, and all of elements in places in the order of removal corresponding to values equal to or greater than the value $N_{p\gamma}$ given by Equation (4) may be added.

At the next step S48, elements to be removed are selected from each of the classes subject to removal determined at step S46, and the selected elements are removed from the layout. Elements to be removed are preferably extracted from the classes subject to removal in a fuzzy manner. In order to perform such fuzzy extraction, fuzzy partitioning is carried out by creating a membership function using the fuzzy c-means method as described in Reference Document 1. The membership function partitions elements in a class subject to removal into elements which are subject to removal and elements which are not subject to removal using an $\alpha$-cut value, and elements to be removed are selected by obtaining the $\alpha$-cut value.

As thus described, according to the ECAT, a plurality of classes are determined as classes subject to removal, and elements to be removed are selected from each of the classes subject to removal using fuzzy partitioning. Therefore, when elements having great evaluation indices are subject to removal, this approach is more preferable than simply removing all elements starting with the class having the greatest evaluation index, in that an optimal solution can be obtained while avoiding localized solutions.

After elements are removed as thus described, elements to be restored (or added) are determined from among the elements which have been removed based on a limiting condition on the void ratio of the tread pattern. Specifically, the void ratio of the layout after the removal of the elements is first calculated at step S50. The void ratio is the ratio of the surface area of the groove portions (portions having no contact with the ground) to the entire surface area of the tread pattern in one pitch unit. Normally, an upper limit for the void ratio is set in the range from 0.25 to 0.45 as the constraint condition.

Next, it is determined at step S52 whether the calculated void ratio satisfies the constraint condition or not. When the constraint condition is not satisfied or when the calculated void ratio is in the excess of the upper limit for the void ratio that is set in advance, the elements which have been removed are added at step S54 to compensate for the shortage of elements. That is, the required number of elements is added among the elements to be removed selected at step S48 such that the contraint condition on the void ratio is satisfied. Since the evaluation indices for the elements removed at step S48 are stored, elements are added in the order of their probabilities of being left on the layout. Specifically, when elements having great evaluation indices are subject to removal, elements are added in increasing order of the magnitude of evaluation indices. When elements having small evaluation indices are subject to removal, elements are added in decreasing order of the magnitude of evaluation indices.

When it is determined at step S52 that the constraint condition is satisfied, the process proceeds to step S56 to finalize a layout of the current generation obtained by removing and adding elements at the above-described steps.

Then, a tire model having the layout of the current generation is created at step S58. At this time, an FEM model is created to represent the entire circumference of a tire by developing one pitch unit of the current generation layout into a plurality of pitches in the circumferential direction of the tire. A method of developing a pattern of one pitch unit of the current-generation layout will now be described with reference to FIGS. 7 and 8.

Figure 7:
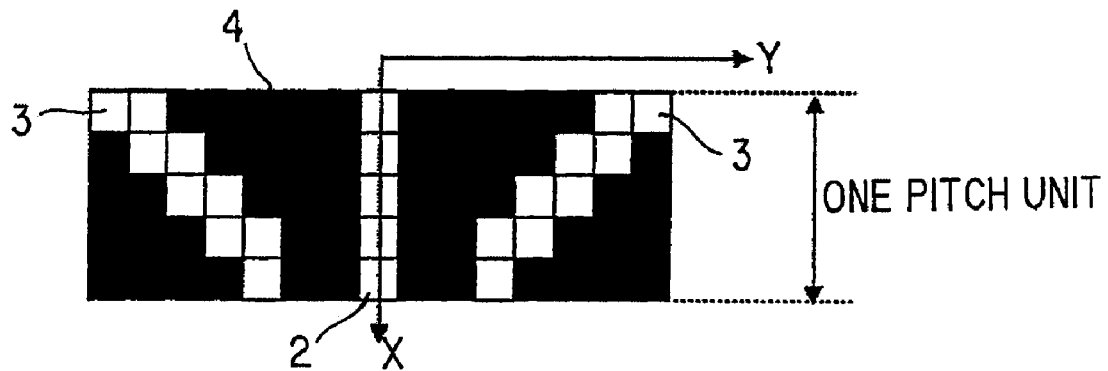
FIG. 7 shows an example of features in one pitch unit of a tread pattern.
Figure 8:
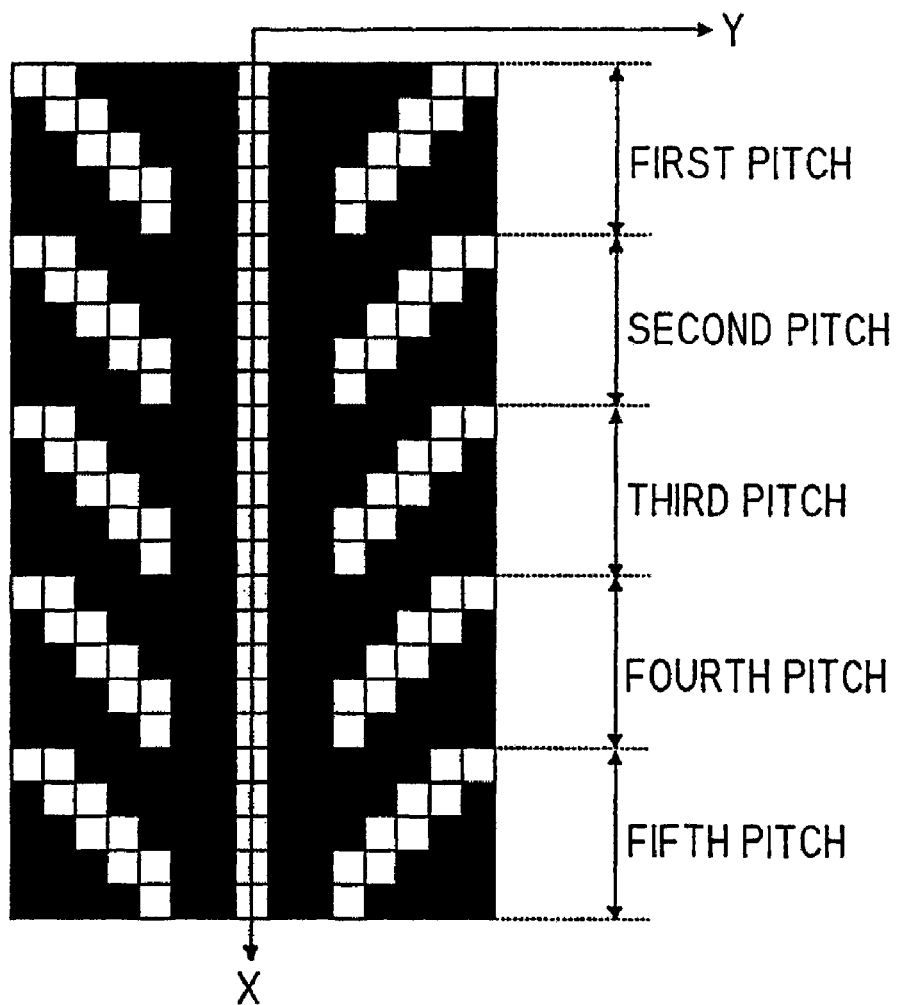
FIG. 8 shows an example in which the features in the one pitch unit are developed into five pitches.

FIG. 7 shows features of one pitch unit of a tire tread pattern extending the entire width of the tread. Reference numeral 2 represents a main groove (a groove in the circumferential direction). Reference numeral 3 represents lateral grooves. The black regions indicated by reference numeral 4 represent land portions. X represents the circumferential direction of the tire, and Y represents the width direction of the tire. The features of one pitch unit are periodically disposed in a predetermined number of pitches in the circumferential direction X of the tire as shown in FIG. 8. In the example shown in FIG. 8, the features are periodically disposed to define five pitches, i.e., first to fifth pitches.

Next, at step S60, the FEM model of the current generation layout thus obtained is used to execute a structural analysis similar to that at step S42 described above, and an evaluation index is calculated for each element on the ground contact surface of the tire tread pattern.

At step S62, the convergence of an objective function is determined. The objective function is calculated from the evaluation indices obtained through the structural analysis. For example, when the objective function is distribution of the ground contact pressure of the tire, it is calculated from the distribution of the ground contact pressure at each element which is an evaluation index. For example, convergence is determined based on whether the difference between the value of the objective function for the layout of the preceding generation and the value of the objective function for the layout of the current generation is smaller than a predetermined value or not.

When such determination indicates that the objective function has not converged yet, the layout is updated to the layout of the current generation, and the process returns to step S44. That is, elements are classified at step S44 using the layout of the current generation as an initial value, and the process then proceeds to step S46 and so on. Thus, steps S44 to S62 are repeated until the objective function is converged. When it is determined at step S62 that the objective function has converged, the layout of the current generation at that time is determined to be an optimal solution for the tread pattern shape (step S64).

Next, at step S22, a tire model having a tread pattern shape optimized as described above is created. Thereafter, determination of convergence is carried out at step S24 based on the optimal solution obtained at step S20. For example, the determination of convergence is made based on a difference between the optimal solution obtained at step S20 and the initial layout before the optimization at step S20. When the difference between the initial layout before the step S20 and the optimized layout after step S20 is equal to or greater than a predetermined threshold, it is determined that convergence has not been achieved, and the process returns to step S14. When the difference is smaller than the predetermined threshold, it is determined that convergence has been achieved, and the process proceeds to step S26. What is required is that the determination of convergence is made based on an optimal solution. Therefore, the determination may be made based on whether the value of the objective function calculated from the optimal solution remains unchanged across step S20 instead of the determination based on a difference between layouts as described above.

When the process returns to step S14 as described above, a numerical optimization for the tire structure is carried out using the tire model having an optimized tread pattern shape created at step S22 in the same manner as described above, the optimization being carried out with the tread pattern shape kept fixed.

Steps S14 to S24 are repeated until it is determined at step S18 or S24 that convergence has been achieved. When it is determined that convergence has been achieved, the tire structure and the layout of the tread pattern shape at that time are adopted as optimal solutions at step S26, and the tire structure and the tread pattern shape are finalized based on the optimal solutions.

Vulcanization molding can be carried out according to a normal method to manufacture a pneumatic tire in practice from a design of a tire having such a tire structure and tread pattern shape. It is therefore possible to provide a pneumatic tire which is improved in terms of the tire performance associated with the objective function.

In the present embodiment, a tire structure is optimized by performing a numerical optimization using a tire model having a tread pattern shape obtained at the immediately preceding cycle of optimization. A tread pattern shape is optimized by performing a numerical optimization using a tire model having a tire structure obtained at the immediately preceding cycle of optimization. Convergence is determined based on optimal solutions obtained from those numerical optimizations, and the two types of optimizations are repeated until convergence is achieved. Since optimization of a tire structure and optimization of a tread pattern shape are carried out on the basis of weak coupling, optimal design specifications can be efficiently obtained for a tire as a whole at a low computational cost.

In the present embodiment, the ECAT is used to optimize the shape of a tread pattern, and optimization is carried out based on a global distribution of evaluation indices. Thus, a global optimal solution can be obtained instead of reaching localized solutions. Since the approach results in smaller computational loads when compared to the use of a generic algorithm according to the related art, features of a tread pattern can be more efficiently designed.

In the present embodiment, a structural analysis and determination of convergence of an objective function is carried out using an FEM model provided by developing one pitch unit of a layout into a plurality of pitches in the circumferential direction of the tire.

A process of removing and adding elements is carried out using a value obtained by integrating values for those pitches to represent one pitch unit. In general, a tire tread pattern has tread features configured by disposing features in one pitch unit such that they periodically appear in the circumferential direction. Therefore, optimization can be carried out in a more practical manner by evaluating the pattern using evaluation indices and an objective function in a plurality of pitches. Since the process of removing and adding elements is carried out using an integrated value representing one pitch unit, it is possible to avoid the problem of variation of a design of a feature between pitches.

Modification of the First Embodiment

Figure 9:
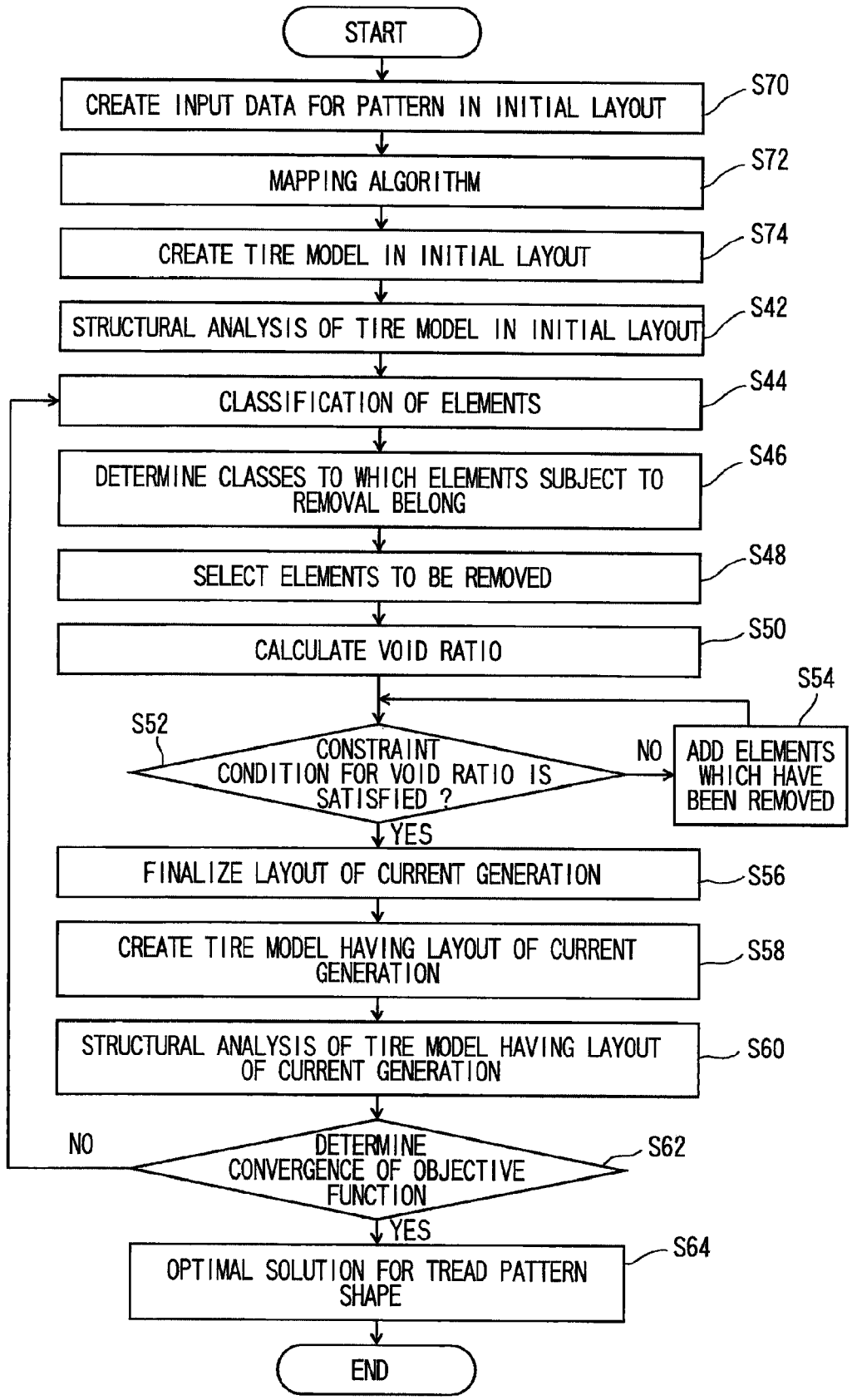
FIG. 9 is a flow chart showing a flow of a numerical optimization for a tread pattern shape according to an ECAT in a modification of the first embodiment.
Figure 10:
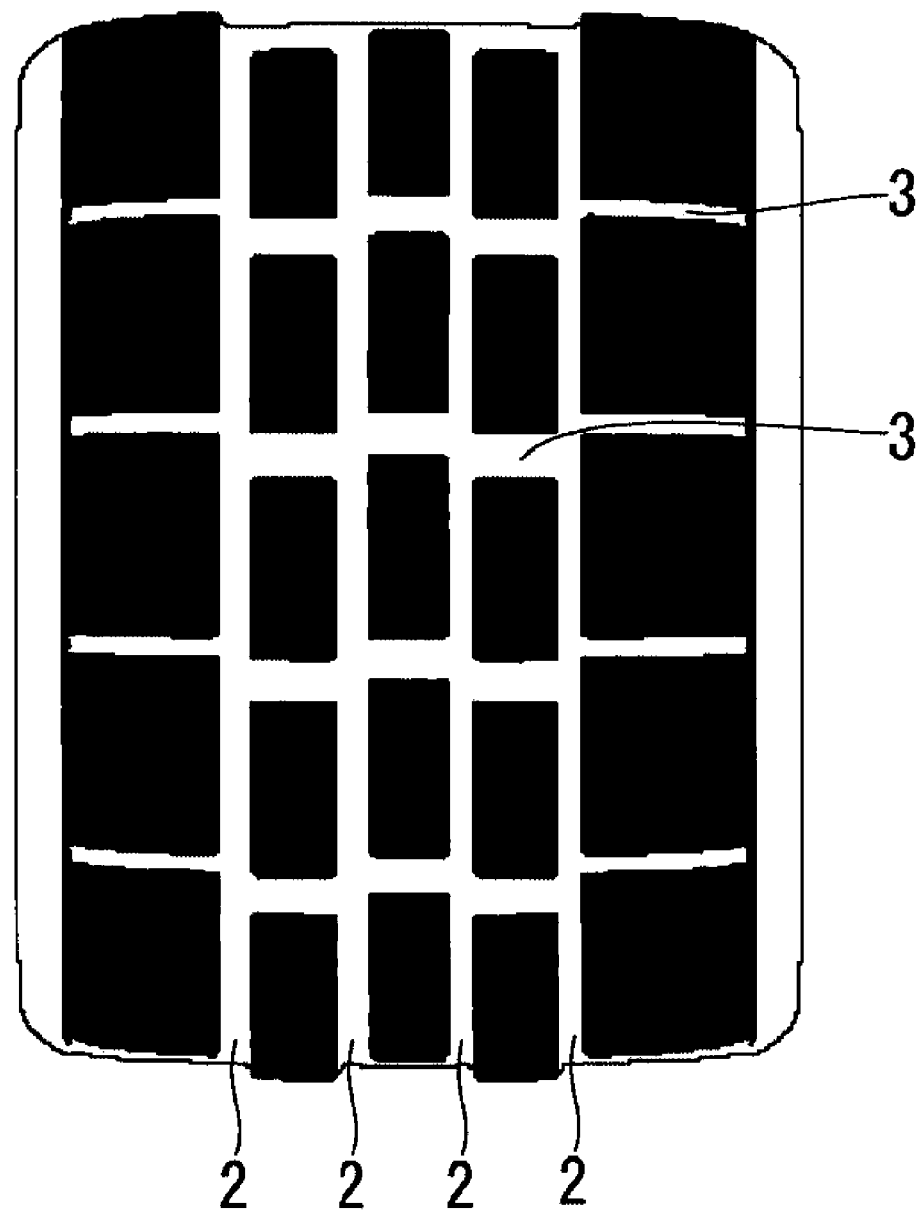
FIG. 10 is a plan view of an initial layout to be subjected to the tread pattern shape optimization in the modification.

FIG. 9 is a flow chart showing a numerical optimization for a tread pattern shape according to a modification of the first embodiment. In this modification, a tire tread pattern has circumferential grooves and lateral grooves in its initial layout. When a tire tread pattern is designed, the pattern designing is limited to some extent. For example, a general specification may be made for the design of the tread pattern such that the pattern will have main grooves 2 and lateral grooves 3 as shown in FIG. 10. In this case, optimization is carried out using the specified tread pattern as an initial layout.

In the present modification, the tread pattern specified as described above is used as an initial layout. In order to execute a structural analysis of a tire model having the initial layout, the tire model is automatically generated from an FEM model of a tire having a main groove only. Specifically, the following steps are taken.

At step S70, input data associated with the tread pattern in the initial layout are created. Specifically, coordinate data of figures representing the tread pattern specified as described above are created and input.

At step S72, in order to create a tire model having a tire tread pattern in the initial layout specified as described above from the tire model having a main groove only, a mapping algorithm is carried out using the input data. The mapping algorithm is carried out on features in one pitch unit of the tread pattern.

Figure 11:
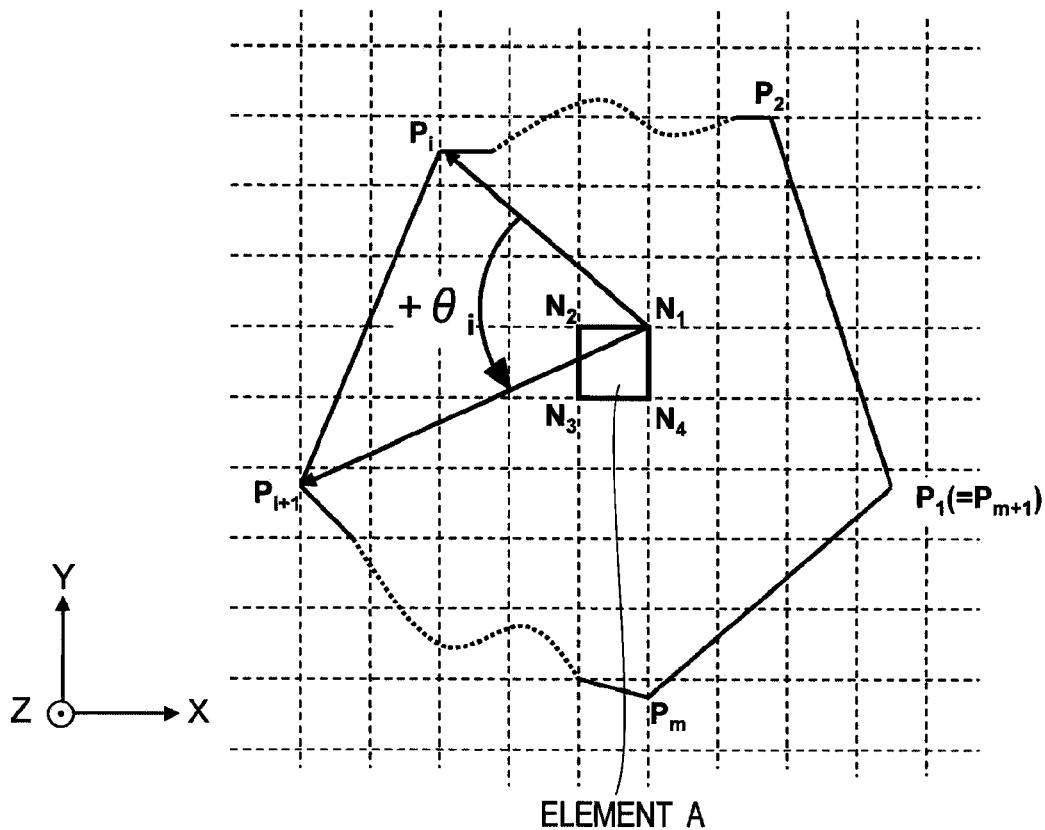
FIG. 11 is a diagram showing an example in which a finite element belongs to a closed figure in a mapping process.

Processes performed according to the mapping algorithm will now be described. FIG. 11 shows a relationship between a closed figure (m-polygon) $P_1$-$P_2$-...-$P_i$-$P_{i+1}$-...-$P_m$ that is one of features of the initial layout and the FEM mode, dotted lines representing finite elements. Let us first discuss a node $N_1$ which is one of nodes forming a finite element A. First, the vector product of a vector $N_1P_i$ and a vector $N_1P_{i+1}$ is obtained, and the sign of a z-component of the vector product is identified. At the same time, an angle $\theta_i$ (<180°) defined by the vector $N_1P_i$ and the vector $N_1P_{i+1}$ is obtained. This process is carried out for each value of "i" (i=1 to m). Next, Equation (5) shown below is calculated. It is determined that the node $N_1$ is in the closed figure when $|\theta_{total}| > 180°$ and that the node $N_1$ is out of the closed figure when $|\theta_{total}| \leq 180°$.

$$\theta_{total} = \sum_{i=1}^{m} \varepsilon_i \cdot \theta_i \quad (5)$$

where $\varepsilon_i$ is +1 when the z-component of the vector product is positive and $\varepsilon_i$ is −1 when the z-component of the vector product is negative.

Such a relationship is similarly checked at nodes $N_2$, $N_3$, and $N_4$, and it is determined that the element belongs to the closed figure only when all of the nodes forming the single element are located inside the closed figure.

Relationships between all finite elements in one pitch unit of the tread pattern and features in the initial layout are identified as thus described to create an FEM model of the tread pattern constituting one pitch unit. The unit is disposed in a predetermined number of pitches in the circumferential direction to create a tire model having an initial layout with the tread pattern specified as described above (step S74). Thereafter, step S42 and steps subsequent thereto are performed in the same way as in the first embodiment to perform a numerical optimization for the shape of the tread pattern.

According to the present modification, even when there are limitations on the design of a tire tread pattern, an analytical model for the pattern can be automatically generated in a design which is needed to be defined as an initial layout. Therefore, a tread pattern can be designed efficiently even when there are limitations on designing.

EXAMPLE 1

A specific example (Example 1) in the first embodiment will now be described. In Example 1, a structural analysis was carried out on a tire having a tire size 225/45R17 at an air pressure of 220 kPa and a load of 5782N using a rim type 17×7.5JJ. Distribution of a ground contact pressure of the tire was used as an objective function, and an optimization problem for minimizing the ground contact pressure distribution was defined.

Figure 12:
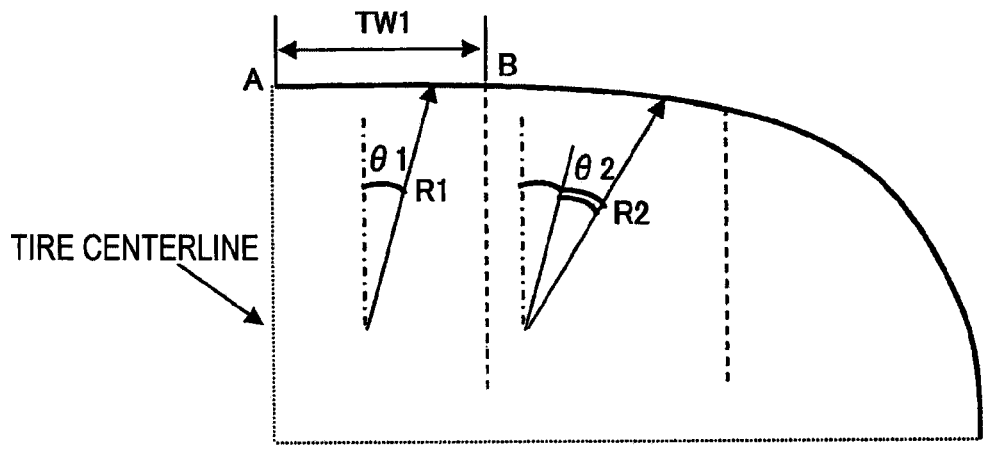
FIG. 12 shows a tire mold profile diagram showing design variables used in the tire structure optimization in Example 1.

An outer shape of a section of the tire (the shape of the mold) was chosen as a tire structure to be optimized, and the following quantities, which are shown in FIG. 12, were used as design variables.

R1: the radius of an arc centered on the center line of the tire and passing through a point A (the radius had an initial value of 1000 mm, and it was limited to the range from 800 to 2000 mm.)

R2: the radius of an arc centered on a line segment of a length R1 connecting a certain point on the tire center line and a point B and passing through the point B (the radius had an initial value of 350 mm, and it was limited to the range from 250 to 450 mm.)

θ1: an included angle between the tire center line and a straight line extended from the center of the arc R1 (the angle had an initial value of 1.8°, and it was limited to the range from 1.4° to 2.3°)

θ2: an included angle between a line connecting the center of the arc R2 and the point B and a straight line extended from the center of the arc R2 (the angle had an initial value of 4.7°, and it was limited to the range from 3° to 6.3°)

Figure 13A:
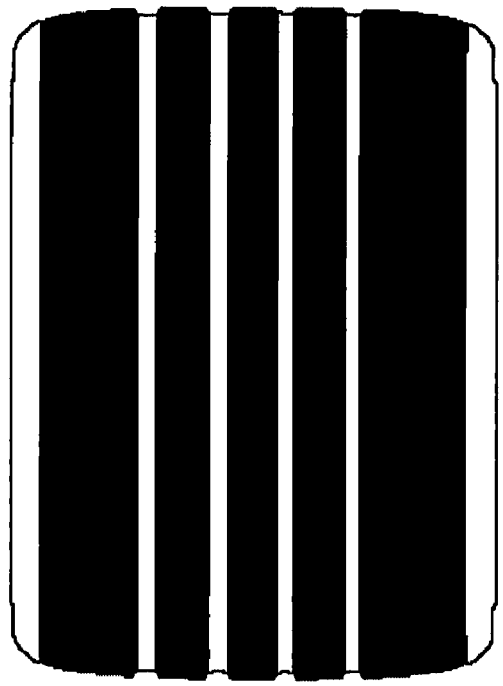
FIG. 13A is an illustration of an initial layout of a tread pattern shape in Example 1.

Distribution of a ground contact pressure at each element was used as an evaluation index for a numerical optimization of a tread pattern shape. A tread pattern having main grooves only as shown in FIG. 13A was used as an initial layout of the tread pattern shape (FIG. 13A shows a landing shape of the tire having five pitches of the layout extending in the circumferential direction). A structural analysis was carried out by developing the layout into five pitches in the circumferential direction. Elements were categorized into 20 classes, and a removal factor β=1.3 and an α-cut value=0.96 were used. A void ratio upper limit of 0.35 was set.

Figure 13B:
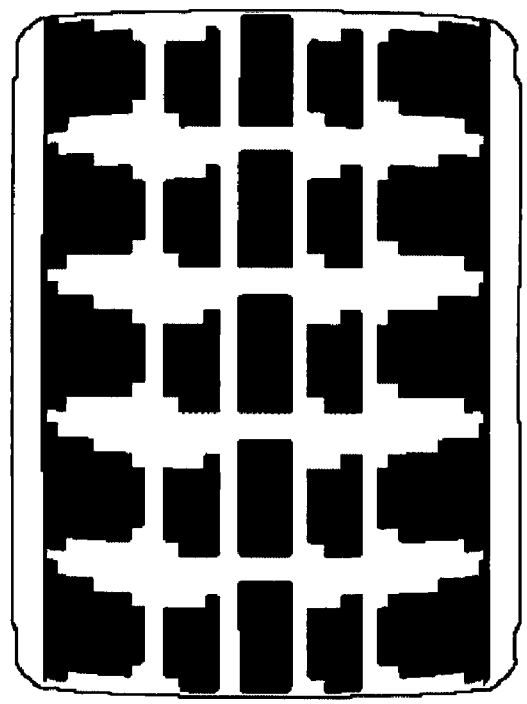
FIG. 13B is an illustration of a final layout obtained through optimization in Example 1.

As a result, optimal solutions of the tire structure were R1=950 mm, R2=310 mm, θ1=1.7°, and θ2=4.2°. An optimal solution (final layout) of the tread pattern as shown in FIG. 13B was obtained (FIG. 13B shows a landing shape of the tire having five pitches of the layout extending in the circumferential direction).

A design method on a trial-and-error basis involving repetition of a cycle of designing, structural analysis, and re-designing according to the related art was carried out as comparative example 1 for comparison with Example 1. A numerical optimization was carried out using the ECAT for a tread pattern shape only without optimizing a tire structure, as comparative example 2. Further, a numerical optimization was carried out using mathematical programming for a tire structure only without optimizing a tread pattern shape, as comparative example 3.

Table 1 shows computational costs required for optimization carried out by Example 1 and comparative examples 1 to 3. Table 1 also shows the effect of improving an objective function (ground contact pressure distribution) achieved on a conventional product tire as a controlled tire.

Referring to the effect of improving the objective function, analytical values of the objective function obtained by a structural analysis and actual measured values of the function obtained by fabricating tires in practice are shown in the form of index numbers relative to an analytical value and an actual measured value, each of which is assumed to be 100, of ground contact pressure distribution of the tire in the conventional product tire. The computational costs are shown in the form of index numbers relative to the time required for calculations in comparative example 1 which is assumed to be 100. A numerical value on the table represents a shorter calculation time and means that a more significant advantage is achieved in computational cost, the smaller the numerical value is.

Second Embodiment

Figure 14:
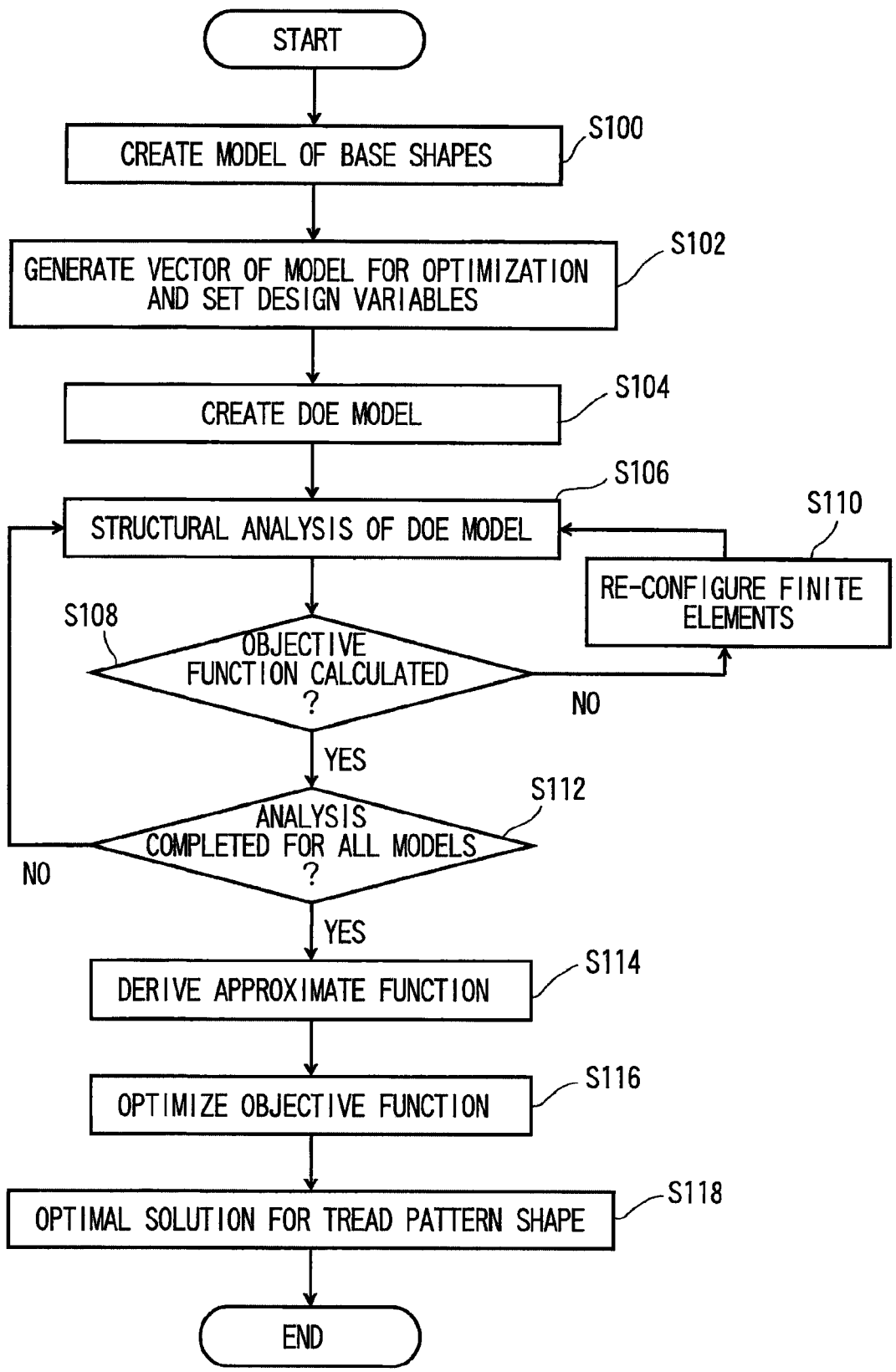
FIG. 14 is a flow chart showing a flow of a numerical optimization according to a basis vector process involved in a numerical optimization for a tread pattern shape in a second embodiment of the invention.

FIG. 14 is a flow chart showing a flow of processes of a numerical optimization for a tire tread pattern shape according to a design method in a second embodiment. In the present embodiment, optimization of a tire structure and optimization of a tread pattern shape according to a basis vector process are carried out on the basis of weak coupling. The present embodiment is similar to the first embodiment except for a numerical optimization for a tread pattern shape.

In the present embodiment, when a numerical optimization for a tread pattern shape is carried out at step S20 of the flow chart shown in FIG. 1, the optimization is carried out using a basis vector process.

In the numerical optimization using a basis vector process, models of a plurality of base shapes are first created at step S100 based on a model of an original shape that is an initial shape of a tread pattern.

Figure 15B:
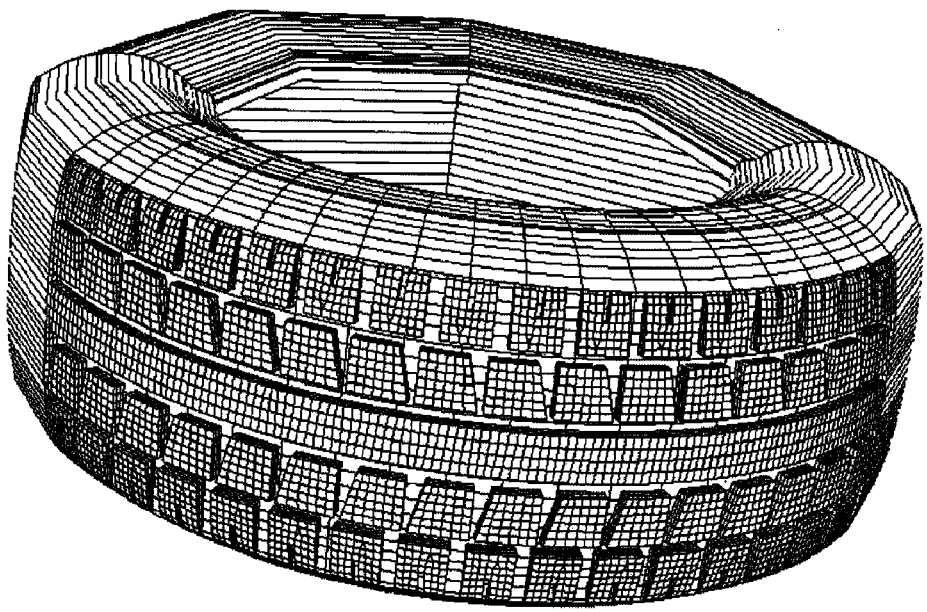
FIG. 15B shows a tire model having a tread pattern shape in an optimized layout in Example 2.
Figure 15A:
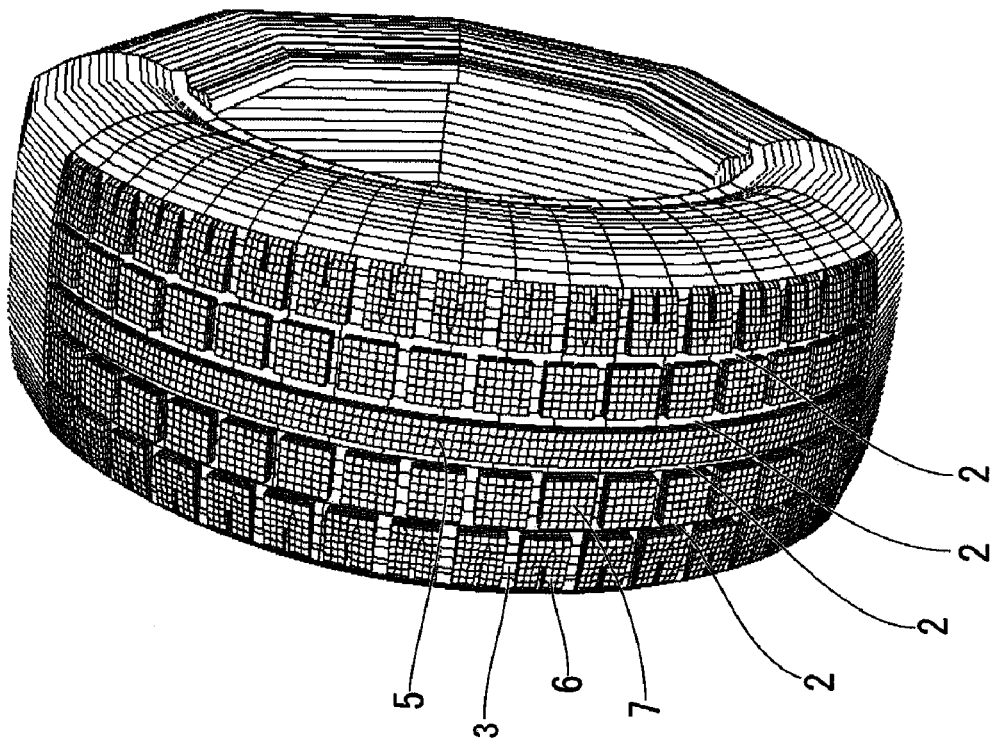
FIG. 15A shows a tire model having a tread pattern shape in an initial layout in Example 2.

FIG. 15A shows an example of a tire model having a tread pattern in the original shape, and FIG. 16A shows a model of the original shape in one pitch unit of the tread pattern. In this example, the tread pattern has four main grooves 2 extending in the circumferential direction, and a center rib 5 provided in a central region in the middle of the tire in the width direction thereof to continuously extend in the circumferential direction of the tire. The tread pattern has blocks 6 and 7 defined by lateral grooves 3 in shoulder regions on both ends in the width direction and intermediate regions sandwiched between the shoulder regions and the central region.

FEM models of the plurality of base shapes are created based on such an FEM model of the original shape. A base shape is a tread pattern shape which has the same number of nodes and element combination information as those of the original shape and which has node coordinate values different from those of the original shape. The number of nodes is the total number of mesh intersections forming the FEM model. Element combination information is information identifying nodes included in each element constituting the FEM model and indicating the order in which the nodes are included.

TABLE 1

|  |  | Conventional Product | Comparative Example 1 | Comparative Example 2 | Comparative Example 3 | Example 1 |
|---|---|---|---|---|---|---|
| Optimization | Tread Pattern | — | — | Yes | — | Yes |
|  | Tire Structure | — | — | — | Yes | Yes |
| Objective Function (Ground Contact Pressure Distribution) | Analytical Value | 100 | 96 | 94 | 93 | 90 |
|  | Measured Value | 100 | 97 | 93 | 94 | 91 |
| Computation Cost |  | — | 100 | 70 | 71 | 75 |

As shown in Table 1, ground contact pressure distribution was significantly improved in Example 1 compared to that in the tires according to the conventional product and comparative example 1, and Example 1 had a calculation time significantly shorter than that of comparative example 1. Example 1 had ground contact pressure distribution better than that of comparative examples 2 and 3 which were optimized in only either of the tire structure and the tread pattern shape.

Node coordinate values are coordinate values indicating the position of each node relative to an origin serving as a reference.

The FEM models of the base shapes are created such that they have shapes different from the original shape by varying the node coordinate values of the FEM model of the original shape with the number of nodes and element combination kept unchanged. Referring to the method of varying the node coordinate values, an operator may vary the node coordinate values of the FEM model of the original shape using an input unit such as a mouse while monitoring an image of the model. Alternatively, the node coordinate values may be automatically varied by a computer according to predetermined rules. Although there is no particular limitation on the number of base shapes created, it is normally preferable to create 10 or less such shapes when computational costs are considered. The number may be input by an operator based on a request signal from a computer.

For example, FIGS. 16B, 16C, and 16D show models of three base shapes created from the model of the original shape shown in FIG. 16A. Specifically, FIG. 16B, 16C, and 16D show FEM models of a base shape 1, a base shape 2, and a base shape 3, respectively.

At the next step S102, an FEM model for optimization is created, and design variables are set. Specifically, node coordinate values of the FEM models created as described above are regarded as components of vectors, and new vectors are created by linearly combining those vectors. An FEM model for optimization is configured using coordinate values of each node which are components of the new vectors.

In this example, a difference between a vector whose components are the coordinate values of a node of the original shape and a vector whose components are the coordinate values of a node of a base shape as described above is defined as a basis vector. Such basis vectors are linearly combined to define a vector whose components are the coordinate values of each node of the optimization model. Such a vector of the optimization model is expressed by Equation (6) shown below.

$$\vec{X}_{VAR} = \vec{X}_{ORG} + \sum_i \alpha_i (\vec{X}_{ORG} - \vec{X}_{BASE,i}) \quad (6)$$

where $\vec{X}_{ORG}$ represents a vector whose components are the coordinate values of a node of the original shape; $\vec{X}_{BASE,i}$ represents a vector whose components are the coordinate values a node of a base shape; $\vec{X}_{VAR}$ represents a vector whose components are the coordinate values of each node of the optimization model; $\alpha_i$ represents a factor for linear combination; and i represents a number assigned to the base shape.

Weighting factors for linear combination represented by $\alpha_i$ are defined as design variables in numerical optimizations which will be described later. A range of limitation is set for each of the weighting factors.

Next, numerical optimizations are performed using Equation (6). The numerical optimizations are performed based on a relational expression between a vector of the optimization model and basis vectors which is shown above as Equation (6) to obtain values of design variables at which an objective function as described above is optimized. Various known methods of optimization may be used for such numerical optimizations, including design of experiments (DOE) methods, methods utilizing generic algorithms, and mathematical programming. In the present embodiment, an example of numerical optimizations according to a DOE method will be described.

First, a plurality of DOE models are created according to conditions for allocation of a design of experiments based on the DOE method at step S104. Specifically, design variables are allocated to columns of an orthogonal table based on the DOE method. Referring to the orthogonal table, since there are three design variables in the present embodiment, an L27 three-level orthogonal table is used. The design variables $\alpha_1$, $\alpha_2$, and $\alpha_3$ are changed to three levels corresponding to a lower limit value, an intermediate value and an upper limit value of the above-mentioned range of limitation and are allocated to the orthogonal table. Then, the values of the design variables are varied according to respective conditions for allocation to create FEM models for optimization in the number of rows of the orthogonal table or 27 FEM optimization models as DOE models according to Equation (6).

Next, at step S106, an FEM analysis is carried out to obtain an objective function for each of the DOE models obtained as described above. Specifically, each objective function is obtained by performing a structural analysis with analysis conditions applied to the respective FEM model for optimization.

Such a structural analysis may fail to converge, and some objective functions may not be calculated. Such a failure frequently occurs when some of elements of an optimization FEM model created based on the DOE method as described above are a significantly distorted in shape. When no objective function is calculated for a certain optimization FEM model (step S108: No), the mesh is redefined for the distorted elements to reconfigure the elements by dividing the elements into the form of a mesh (step S110). Thereafter, a structural analysis is carried out using the re-configured optimization FEM model to calculate an objective function (step S106). Thus, the problem of a failure in calculating an objective function can be solved. Since such redefinition is required only for particular regions having distorted elements of a particular FEM model as described above, increase in computational cost can be suppressed.

Such a structural analysis is repeated until an objective function is calculated for all of the 27 optimization FEM models (step S108: Yes and step S112: No), and the process proceeds to the next step when an objective function is obtained for all of the FEM models (step S112: Yes).

At the next step S114, the objective functions are represented as a function of the design variables from the relationship between the objective functions and the design variables identified as described above. Specifically, the objective functions are converted into an approximate function (response curve) of the design variables by performing polynomial approximation using a method such as regression analysis.

Thereafter, at step S116, design variables at which the objective functions are optimized are obtained from the approximate function. For example, let us assume that the objective function is distribution of the ground contact pressure of the block and it is desired to minimize the ground contact pressure distribution. Then, the design variables included in the approximate function are varied to minimize the ground contact pressure distribution, whereby an optimal solution for the tread pattern shape is obtained (step S118).

The configuration of the present embodiment is otherwise similar to that of the first embodiment, and no further description is therefore made on the configuration.

Optimization of a tire structure and optimization of a tread pattern shape are carried out on the basis of weak coupling also in the second embodiment. Therefore, the present embodiment is advantageous in that optimal design specifications can be efficiently obtained for a tire as a whole at a low computational cost, just as in the first embodiment.

In the second embodiment, a model for optimization to be subjected to a numerical optimization for optimizing a tread pattern shape is generated using a basis vector process. The embodiment is therefore obviously different from optimization methods according to the related art in the way of providing design variables determining the shape of a tread pattern. Specifically, according to methods for optimizing a tread pattern shape in the related art, elements which directly determine a tread pattern shape such as the length and shape of each edge of a block are used as design variables. Therefore, the use of such methods is limited to tread pattern shapes such as straight lines and sine curves which can be defined using a parameter having a fixed form. Thus, such methods have a problem in that they allow an optimal solution to be searched only in a limited range and in that a mesh forming finite elements must be redefined each time design variables are changed. On the contrary, in the present embodiment, since a weighting factor for each basis vector is generated as a design variable using a basis vector process, it is therefore possible to easily create a complicated tread pattern shape which is difficult to define using a parameter having a fixed form. Therefore, an optimal solution can be searched in a wider range, and tire performance can be improved. Since each change in a design variable rarely necessitates redefining of the mesh of a model, man-hour for designing can be reduced.

While the present embodiment has been described as a case in which features in one pitch unit of a tread pattern are optimized, it may be used to optimize the shape of one block of a tread pattern.

EXAMPLE 2

A specific example (Example 2) in the second embodiment will now be described. In Example 2, a structural analysis was carried out on a tire having a tire size 205/65R15 at an air pressure of 200 kPa and a load of 450N using a rim type 15×6JJ. Distribution of a ground contact pressure of the tire was used as an objective function, and an optimization problem for minimizing the ground contact pressure distribution was defined.

Referring to the tread pattern shape, base shapes 1 to 3 shown in FIGS. 16B, 16C, and 16D, respectively, were created based on an original shape as shown in FIG. 16A. Referring to ranges of limitation, a weighting factor $\alpha 1 = -1$ to 1 was applied to the base shape 1; a weighting factor $\alpha 2 = -1$ to 1 was applied to the base shape 2; and a weighting factor $\alpha 3 = -1$ to 1 was applied to the base shape 3.

As a result of an analysis, optimal solutions for the tire structure were R1=1200 mm, R2=250 mm, and TW1=36 mm. Optimal solutions $\alpha 1 = 1$, $\alpha 2 = -1$, and $\alpha 3 = -1$ were obtained for the respective design variables for the tread pattern. An optimized layout as shown in FIG. 15B was obtained.

A design method on a trial-and-error basis involving repetition of a cycle of designing, structural analysis, and re-designing according to the related art was carried out as comparative example 4 for comparison with Example 2. A numerical optimization was carried out using the basis vector process for a tread pattern shape only without optimizing a tire structure, as comparative example 5. Further, a numerical optimization was carried out using mathematical programming for a tire structure only without optimizing a tread pattern shape, as comparative example 6.

Table 2 shows computational costs required for optimization carried out by Example 2 and comparative examples 4 to 6 using index numbers where the time required for the calculation in comparative example 4 is represented by an index number 100. Table 2 also shows the effect of improving an objective function (ground contact pressure distribution) using index numbers representing analytical values and measured values where each of an analytical value and an actually measured value of ground contact pressure distribution of the conventional product tire is represented by an index number 100.

TABLE 2

| | | Conventional Product | Comparative Example 4 | Comparative Example 5 | Comparative Example 6 | Example 2 |
|---|---|---|---|---|---|---|
| Optimization (Ground Contact Pressure Distribution) | Tread Pattern | — | — | Yes | — | Yes |
| | Tire Structure | — | — | — | Yes | Yes |
| Objective Function | Analytical Value | 100 | 96 | 94 | 93 | 89 |
| | Measured Value | 100 | 97 | 95 | 93 | 89 |
| Computation Cost | | — | 100 | 66 | 70 | 76 |

An outer shape of a section of the tire (the shape of the mold) was chosen as a tire structure to be optimized, and the following quantities, which are shown in FIG. 12, were used as design variables.

R1: the radius of an arc centered on the center line of the tire and passing through a point A (the radius had an initial value of 1000 mm, and it was limited to the range from 700 to 1300 mm.)

R2: the radius of an arc centered on a line segment of a length R1 connecting a certain point on the tire center line and a point B and passing through the point B (the radius had an initial value of 200 mm, and it was limited to the range from 100 to 300 mm.)

TW1: the distance from the point A to an intersection between the two arcs in the width direction (the distance had an initial value of 38 mm, and it was limited to the range from 28 to 48 mm)

As shown in Table 2, ground contact pressure distribution was significantly improved in Example 2 compared to that in the tires according to the conventional product and comparative example 4, and Example 2 had a calculation time significantly shorter than that of comparative example 4. Example 2 had ground contact pressure distribution better than that of comparative examples 5 and 6 which were optimized in only either of the tire structure and the tread pattern shape.

Third Embodiment

FIG. 17 is a flow chart showing a flow of process of a method of designing a pneumatic tire in a third embodiment. In the present embodiment, optimization of a tire structure, optimization of a tread pattern shape using a basis vector process, and optimization of the shape and topology of the tread pattern using an ECAT are carried out on the basis of weak coupling.

Specifically, in this embodiment, a tire structure is optimized in the same way as in the first embodiment (steps S10 to S16). After convergence is determined (step S18), a numerical optimization for a tread pattern shape is carried out using a basis vector process with the tire structure kept fixed at step S150. Details of the numerical optimization are the same as those in the second embodiment.

After an optimal solution for the tread pattern shape is obtained according to a basis vector process as thus described (step S152), a numerical optimization for the tread pattern shape is carried out at step 154 using an ECAT with the tire structure kept fixed. Details of the numerical optimization are the same as those in the first embodiment. It should be noted that the numerical optimization at step S154 is carried out using the optimal solution for the tread pattern shape obtained using a basis vector process at step S152 as an initial layout. Therefore, just as in the modification of the first embodiment shown in FIG. 9, input data for the initial layout pattern are created, and a tire model having the optimal solution for the tread pattern shape obtained according to a basis vector process as an initial layout is created using a mapping algorithm (steps S70 to S74).

After the optimal solution for the tread pattern shape is obtained as thus described, a tire model having the tread pattern shape optimized at step S22 is created just as in the first embodiment, and convergence is thereafter determined at step S24 based on the optimal solution obtained at step S154.

The configuration of the present embodiment is otherwise similar to that of the first embodiment, and no further description is therefore made on the configuration.

In the present embodiment, optimization of a tire structure, optimization of a tread pattern shape using a basis vector process, and optimization of the shape and topology of the tread pattern using an ECAT are carried out on the basis of weak coupling. Therefore, the present embodiment is advantageous in that optimal design specifications can be efficiently obtained for a tire as a whole and in that tire performance can be further improved.

In the third embodiment, a tread pattern shape is optimized first by performing a numerical optimization using a basis vector process and thereafter performing a numerical optimization using an ECAT. Alternatively, the numerical optimization using an ECAT may be performed first and followed by the numerical optimization using a basis vector process. In this case, the optimization according to a basis vector process is carried out using the tread pattern shape optimized by the preceding optimization using an ECAT as an original shape.

In the third embodiment, one pitch unit of a tread pattern shape is optimized by the numerical optimization using a basis vector process. Alternatively, only the shape of a block included in the tread pattern shape may be designed.

Determination of convergence similar to that of step S24 may be inserted between the numerical optimization using a basis vector process at step S150 and the numerical optimization using an ECAT at step S154, which allows weak coupling to be established between all of the optimization of the tire structure, the optimization of the tread pattern shape using a basis vector process, and the optimization of the tread pattern shape using an ECAT.

EXAMPLE 3

A specific example (Example 3) in the third embodiment will now be described. Example 3 is similar to Example 1 in the size of the tire of interest, conditions for a structural analysis, the objective function used, design variables associated with the structure of the tire, and ranges of limitations placed on the variables.

An original shape as shown in FIG. 18A was used for a numerical optimization for a tread pattern shape according to a basis vector process. Base shapes 1 and 2 shown in FIGS. 18B and 18C were creased based on the original shape. Referring to ranges of limitation, a weighting factor $\alpha 1$ for the base shape 1 was in the range from −1 to 1, and a weighting factor $\alpha 2$ for the base shape 2 was in the range from −1 to 1.

Ground contact pressure distribution of each element was used as an evaluation index of a numerical optimization using an ECAT. An optimal solution obtained using a basis vector process was used as an initial layout, and the layout was developed into five pitches in the circumferential direction of the tire for a structural analysis. Elements were categorized into twenty classes, and a removal factor $\beta$ of 1.3 and an $\alpha$-cut value of 0.96 were used. Further, a void ratio upper limit of 0.35 was set.

Figure 19:
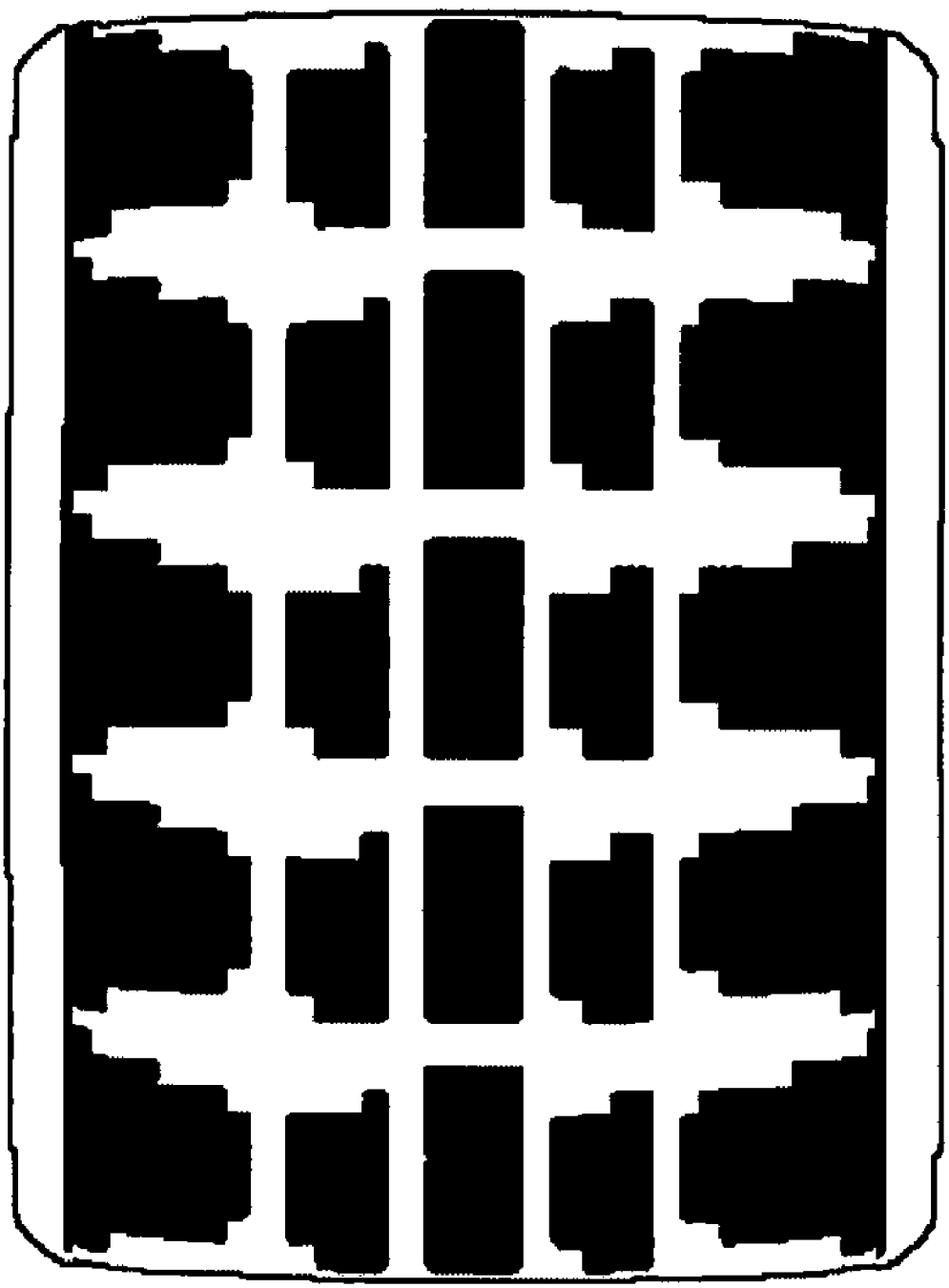
FIG. 19 is an illustration of a final layout obtained through optimization in Example 3.

As a result of an analysis, optimal solutions for the tire structure were R1=820 mm, R2=250 mm, $\theta 1$=1.5°, and $\theta 2$=5.2°. Optimal solutions $\alpha 1$=1 and $\alpha 2$=−1 were obtained for the respective design variables in an optimization according to a basis vector process. An optimized layout as shown in FIG. 18D was obtained. Further, an optimal solution (final layout) of the tread pattern as shown in FIG. 19 was obtained (FIG. 19 shows a landing shape of the tire having five pitches of the layout extending in the circumferential direction).

The computational cost required for the optimization in Example 3 was 85, whereas the computational cost required in comparative example 1 was 100, and a significant reduction in designing time could be achieved. The objective function of Example 3 had an analytical value of 87 and an actually measured value of 85, whereas the conventional product had a value of 100. Example 3 was therefore excellent in the effect of improving ground contact pressure distribution.

OTHER MODES FOR CARRYING OUT THE INVENTION

In the above-described embodiments, optimization of a tire structure is carried out first, and optimization of a tread pattern shape is thereafter carried out. Alternatively, optimization of a tread pattern shape may be carried out first, and optimization of a tire structure may be carried out thereafter.

The invention can advantageously used in designing various types of tires such as pneumatic radial tires.

What is claimed is:

1. A tire design method comprising:
   (a) providing an objective function representative of tire performance;
   (b) performing a numerical optimization using a tire model provided by dividing a tire shape into a plurality of elements to obtain an optimal solution for a tire structure which optimizes the objective function, the optimization being performed with a tread pattern shape kept fixed;
   (c) performing a numerical optimization using a tire model provided by dividing the tire shape into a plurality of elements to obtain an optimal solution for the tread pattern shape which optimizes the objective function, the optimization being performed with the tire structure kept fixed, wherein
      performing the numerical optimization in (b) for the tire structure includes using a tire model having the tread pattern shape optimized at an immediately preceding cycle of (c), and wherein performing the numerical optimization in (c) for the tread pattern shape includes using a tire model having the tire structure optimized at an immediately preceding cycle of (b);

(d) repeating (b) and (c) until convergence of the objective function takes place, convergence being determined based on optimal solutions obtained at (b) and (c); and (e) subsequent to convergence of the objective function, creating a tire design having the optimal solutions for the tread pattern shape and the tire structure.

2. The tire design method according to claim 1, wherein the numerical optimization at (c) is an optimization using an ECAT.

3. The tire design method according to claim 2, wherein (c) comprises:

(c1) creating a tire model having a plurality of elements or divisions of a tire by developing one pitch unit of an initial layout of a tread pattern shape into a plurality of pitches in the circumferential direction of the tire;

(c2) calculating an evaluation index for each element through a structural analysis using the tire model having the initial layout;

(c3) integrating calculated evaluation indices into one pitch unit for each element associated with the indices, classifying the elements according to the magnitudes of the integrated evaluation indices to determine a plurality of classes to which elements subject to removal belong, and selecting elements to be removed from each of classes thus determined;

(c4) selecting elements to be added from among the elements which have been removed;

(c5) obtaining a layout of the current generation through the removal and addition of elements at (c3) and (c4) to create a tire model by developing one pitch unit of the layout into a plurality of pitches in the circumferential direction of the tire;

(c6) calculating an evaluation index for each element through a structural analysis using the tire model of the layout of the current generation; and (c7) determining convergence of the objective function from the calculated evaluation indices, updating the layout to the layout of the current generation and returning to (c3) when it is determined that convergence has not occurred, and adopting the layout of the current generation as an optimal solution of the tread pattern shape when it is determined that convergence has occurred.

4. The tire design method according to claim 3, comprising:

determining elements to be added among the elements which have been removed based on a constraint condition on a void ratio of the tread pattern at (c4).

5. The tire design method according to claim 3, comprising:

selecting elements to be removed from the classes subject to removal using fuzzy partitioning at (c3).

6. The tire design method according to claim 1, the numerical optimization at (c) being an optimization using a basis vector process.

7. The tire design method according to claim 6, wherein (c) further comprises:

(c10) creating models of a plurality of base shapes based on a model of an original shape of at least a part of the tread pattern, the base models having the same number of nodes and the same element combination information as those of the original model and node coordinate values different from those of the original model;

(c11) defining a basis vector from a vector whose components are the coordinate values of a node of the original shape and a vector whose components are the coordinate values of a node of the base shape, defining a vector whose components are the coordinate values of each node of a model for optimization by linearly combining basis vectors, and setting a weighting factor for the linear combination as a design variable; and (c12) obtaining a set of values of the design variables for optimizing the objective function based on an expression representing a relationship between the vector of the model for optimization and the basis vectors to obtain an optimal solution of the shape of at least the part of the tread pattern.

8. The tire design method according to claim 7, wherein (c12) further comprises:

determining that the objective function cannot be calculated when one or more elements of the model for optimization have a distorted shape;

reconfiguring the elements having the distorted shape into a mesh form to provide a revised model for optimization; and calculating the objective function based on the revised model for optimization.

9. The tire design method according to claim 1, wherein (c) further comprises:

(c21) performing a numerical optimization for optimizing the tread pattern shape using an ECAT; and (c22) performing a numerical optimization for optimizing the tread pattern shape using a basis vector process, where one of (c21) or (c22) is executed first, and numerical optimization of the other one of (c21) or (c22) is executed using a tread pattern shape obtained through the optimization at the preceding execution of one of (c21) or (c22) as an initial shape.

10. A tire manufacturing method comprising:

(a) providing an objective function representative of tire performance;

(b) performing a numerical optimization using a tire model provided by dividing a tire shape into a plurality of elements to obtain an optimal solution for a tire structure which optimizes the objective function, the optimization being performed with a tread pattern shape kept fixed;

(c) performing a numerical optimization using a tire model provided by dividing the tire shape into a plurality of elements to obtain an optimal solution for the tread pattern shape which optimizes the objective function, the optimization being performed with the tire structure kept fixed, wherein performing the numerical optimization in (b) for the tire structure includes using a tire model having the tread pattern shape optimized at an immediately preceding cycle of (c), and performing the numerical optimization in (c) for the tread pattern shape includes using a tire model having the tire structure optimized at an immediately preceding cycle of (b);

(d) repeating (b) and (c) until convergence of the objective function takes place, convergence being determined based on optimal solutions obtained at (b) and (c);

(e) creating a tire design having the optimal solutions for the tread pattern shape and the tire structure; and manufacturing a tire according to the tire design.

* * * * *

UNITED STATES PATENT AND TRADEMARK OFFICE
CERTIFICATE OF CORRECTION

| | |
|---|---|
| PATENT NO. | : 8,103,489 B2 |
| APPLICATION NO. | : 12/132006 |
| DATED | : January 24, 2012 |
| INVENTOR(S) | : Naoya Ageishi, Yoshihiro Tanaka and Ken Ishihara |

It is certified that error appears in the above-identified patent and that said Letters Patent is hereby corrected as shown below:

Col. 21, claim 7, line 2, delete "comprises;" and insert -- comprises:--.

Signed and Sealed this
Twenty-fourth Day of April, 2012

David J. Kappos
*Director of the United States Patent and Trademark Office*

UNITED STATES PATENT AND TRADEMARK OFFICE
CERTIFICATE OF CORRECTION

PATENT NO. : 8,103,489 B2
APPLICATION NO. : 12/132006
DATED : January 24, 2012
INVENTOR(S) : Naoya Ageishi, Yoshihiro Tanaka and Ken Ishihara It is certified that error appears in the above-identified patent and that said Letters Patent is hereby corrected as shown below:

Column 21, line 60 (claim 7, line 2) delete "comprises;" and insert -- comprises: --.

This certificate supersedes the Certificate of Correction issued April 24, 2012.

Signed and Sealed this
Fifteenth Day of May, 2012

David J. Kappos
*Director of the United States Patent and Trademark Office*